United States Patent
White

(10) Patent No.: US 7,105,839 B2
(45) Date of Patent: Sep. 12, 2006

(54) METHOD AND FINE-CONTROL COLLIMATOR FOR ACCURATE COLLIMATION AND PRECISE PARALLEL ALIGNMENT OF SCANNED ION BEAMS

(76) Inventor: Nicholas R. White, 9 Spy Rock Hill, Manchester, MA (US) 01944

(*) Notice: Subject to any disclaimer, the term of this patent is extended or adjusted under 35 U.S.C. 154(b) by 234 days.

(21) Appl. No.: 10/807,772

(22) Filed: Mar. 24, 2004

(65) Prior Publication Data

US 2005/0082498 A1   Apr. 21, 2005

Related U.S. Application Data

(60) Provisional application No. 60/511,417, filed on Oct. 15, 2003.

(51) Int. Cl.
  *H01J 37/317* (2006.01)

(52) U.S. Cl. .............. 250/492.21; 250/492.2; 250/492.3; 250/281; 250/282; 250/298; 250/396 R

(58) Field of Classification Search ............ 250/492.21, 250/492.2, 492.3, 281, 282, 298, 396 R
See application file for complete search history.

(56) References Cited

U.S. PATENT DOCUMENTS

| | | | | | |
|---|---|---|---|---|---|
| 5,483,077 | A | * | 1/1996 | Glavish | 250/492.2 |
| 6,703,628 | B1 | * | 3/2004 | Ye et al. | 250/492.21 |
| 6,835,930 | B1 | * | 12/2004 | Benveniste et al. | 250/298 |
| 2003/0205683 | A1 | * | 11/2003 | Benveniste | 250/492.21 |

* cited by examiner

*Primary Examiner*—Nikita Wells
(74) *Attorney, Agent, or Firm*—David Prashker

(57) ABSTRACT

In system for implanting workpieces with an accurately parallel scanned ion beam, a fine-control collimator construct is used to reduce the deviation of the scanned ion beam from a specified axis of parallelism and thereby improve its collimation. The shape of the fine-control collimator matches the ribbon shape of the beam and correction of parallelism in two orthogonal directions is possible. Measurement of the non-parallelism is accomplished by sampling the scanned beam in two planes and comparing timing information; and such measurement is calibrated to the orientation of the workpiece in the plane where ion implantation occurs. Measurement of non-uniformity in the doping profile is accomplished using the same means; and the scan waveform is adjusted to substantially remove any non-uniformity in the doping profile.

16 Claims, 14 Drawing Sheets ly), it is today
METHOD AND FINE-CONTROL COLLIMATOR FOR ACCURATE COLLIMATION AND PRECISE PARALLEL ALIGNMENT OF SCANNED ION BEAMS

PRIORITY CLAIM

The subject matter of the invention was first presented as and claims benefit of U.S. Provisional Patent Application Ser. No. 60/511,417 filed 15 Oct. 2003 and entitled "Multipole Lens And Methods For Accurate Collimation And Alignment Of Scanned Beams".

FIELD OF THE INVENTION

This invention relates generally to the production of parallel ribbon-shaped charged-particle particle beams; is directed to improving the parallelism of scanned ribbon-shaped ion beams used for treating workpieces with ions; and particularly concerns single wafer hybrid scan ion implantation systems in which a semiconductor wafer or other substrate is mechanically passed in one direction through a scanned ion beam which is applied at a higher frequency in an orthogonal direction.

BACKGROUND OF THE INVENTION

Intended Applications:

In the field of ion implantation of semiconductors for transistor fabrication, there is a class of implants which is known as 'parametric' (sometimes also characterized as 'medium current implants') which uses ion doses typically in the range from $2 \times 10^{11}$ to $1 \times 10^{14}$ ions per sq. cm. These implants are generally employed for making fine adjustments in control of transistor parameters—such as for controlling the threshold voltage of the transistors, or for a variety of counter-doping purposes, or for controlling the gradient of doping with precision.

The term 'parametric' describes the role of these implants in controlling the transistor's operating parameters; in comparison, the term 'medium current' reflects the fact that these implants can be performed at high commercial throughputs using relatively low dose beam currents, which typically are below the current level at which space-charge forces would dominate the forces characterizing the ion optics of the implanter system. Medium current implants are typically performed with scanned ion beams. The scanning technique provides a convenient means of controlling the uniformity of the implant.

The incident angle with which the ions impinge on the silicon substrate is of great importance, for a number of reasons, including the following.

a) There is a phenomenon known as 'channeling', whereby the implanted ions penetrate the surface of the substrate more deeply if they align with the crystal axes or planes. This occurs because the fraction of the ions which miss initiating a nuclear scattering event at the first plane of encountered substrate atoms will also miss a large number of subsequent planes of atoms, as the deeper planes of atoms lie in almost perfect alignment below the top layer; and it is quite possible for the ions to be guided down a channel between the aligned planes of atoms in the substrate. Also, it has been found that under certain circumstances, the number of nuclear scattering events which are initiated per incident ion can vary by more than 30% in response to a change in the incident angle of far less than 1 degree.

b) Transistor sizes continue to become ever-smaller. The International Technology Roadmap for Semiconductors, published by International Sematech at http://public.itrs.net, predicts the rate at which the critical dimensions of transistors will continue to shrink. As a result of this dimensional shrinkage, the aspect ratio of the openings in the photolithographic masks becomes greater. Also, an increasing fraction of all implants is performed with the ion beam at zero degrees to the normal to the wafer surface, to prevent poorly controlled shadowing of areas of the regions to be doped by the walls of the openings in the mask. Changes in the incident beam angle thus cause many undesired variations by shadowing and dopant placement in the process parameters, whose significance and magnitude is increased by the ever-shrinking dimensions of transistor size.

c) Certain processes exploit the ability of implantation equipment to vary the incident angle of the ions to a substrate in order to implant the ions (through an opening) beneath another feature on the substrate as a buried dopant. However, small variations in incident angle can cause significant variations in the alignment of the buried dopant.

Therefore, for these reasons (and many others), it is today very important to eliminate as much variation as possible in incident ion angle from wafer to wafer, and particularly between different sites on the same wafer; as well as to control these incident angles with a precision of better than about 0.1 degrees.

It will be noted that in the current generation of ion implanters, prior to reaching the wafer, the ion beam typically passes through a focusing lens or similar device (usually a dipole magnet) whose focus coincides with the center of the beam scanning device, thereby rendering the beam trajectories approximately parallel. Many such devices are conventionally known; and these are commonly and collectively referred to herein as 'Coarse Collimators'.

Serial Implantation Systems:

In conventionally known serial implantation systems, a wafer (or other substrate) is mechanically passed multiple times at constant velocity through a scanned ribbon beam. On each pass, a constant velocity is maintained until each edge of the wafer has substantially cleared the entirety of the ribbon beam. Subsequently, the wafer velocity is rapidly decelerated to zero (a complete stop); and then accelerated to a constant velocity in the opposite direction for another complete pass of the wafer through the ribbon beam. In this manner, the wafer is passed repeatedly multiple times through the beam until the desired full dose of ions has been implanted within the substance of the wafer.

Within such serial implantation systems, the variation of the implant angle remains a variable process parameter requiring ever-tighter control; and some implantation apparatus and systems therefore incorporate devices which use some mode of adjusting the average angle and direction of the beam with respect to the wafer surface. This effort, however, tends to be a single adjustment covering an averaged beam direction; and there remains still a substantial residual individual trajectory variation in beam direction across the locus of the scanned beam within these systems. Also, the adjustment typically combines the system's averaged variation with random changes from day to day in the beam setup conditions. In view of these markedly different and dissimilar circumstances, it would be desirable to measure and compensate for these variations across the full width of the implantation region for the wafer.

Conventionally Used Tools:

In the field of processing substrate materials with ion beams, various techniques have been developed for scanning ion beams and then passing the scanned beam through correcting devices to render the beams more parallel. See for example, U.S. Pat. Nos. 4,276,477; 4,745,281; 4,922,106;

and 5,091,655 which describe techniques for parallel-scanning ion beams, and U.S. Pat. No. 4,980,562, which describes a technique for controlling the uniformity of the implant by modifying the shape of the waveform used to scan the beam. The entirety of U.S. Pat. Nos. 4,276,477; 4,745,281; 4,922,106; 4,980,562; and 5,091,655 individually is expressly incorporated by reference herein.

Techniques have also been developed for producing large, approximately parallel, ion beams as well as for also controlling the uniformity of these beams. These techniques are summarized by White et al., ["The Control of Uniformity in Parallel Ribbon Ion Beams up to 24 inches in Size", in *Applications of Accelerators in Research and Industry*, AIP conference proceedings, vol. 475, 1998, p. 830].

As used herein, the phrase 'controlling the uniformity' means that the current density of charged particles along the long width dimension (the x-axis) of the beam is caused to possess and exist in a desired profile. The density profile itself may be uniform (consistent or homogeneous), or may vary in a chosen pattern or predetermined manner (such as a left-to-right linear ramp).

In contrast, the phrase 'controlling the parallelism' means that the individual trajectories of the charged particles constituting the ion beam as a whole have a common directional angle and maintain a substantially similar spatial distance between them as they travel. Accordingly, the parameter of 'uniformity' for an ion beam should not be confused with, or be misunderstood as, or be misconstrued as either being the functional or definitional equivalent of or being similar to the parameter of 'parallelism' for a traveling ion beam.

Moreover, it is not unusual for one implantation system to attempt to control both parameters—the uniformity and the parallelism—of a traveling ion beam concurrently. For example, the ion implantation system disclosed by U.S. Pat. No. 5,350,926 teaches the use of magnets for analyzing, shaping and rendering more parallel the ion trajectories of a beam; and concurrently, but separately, shows the use of particular multipole elements (integrated or distinct) to control the charged particle uniformity (current density) of the ions in the beam.

Another conventionally known approach, the use of algorithms, should also be properly recognized and understood for what it truly is. Algorithms for adjusting multipoles to achieve greater ion beam uniformity have been developed (as exemplified by those of Diamond Semiconductor Group Inc.); and such algorithms have been used in a variety of commercially manufactured ion implantation products. In one commercial version sold by Mitsui Engineering and Shipbuilding, a discrete multipole structure is present which is formed as a rectangular array of iron pole pieces mounted on a yoke and which surrounds a continuous ion beam via a central rectangular aperture. Each pole piece has a separate wire coil wound around it. When energized, the resulting magnetic field in the central rectangular aperture (through which the continuous ion beam passes) contains spatially varying dipole fields and causes a local deflection of the trajectories for the charged particles passing through it. Subsequently, at a processing stage (or plane of atoms) further downstream in the system, these trajectory deflections produce a well recognized and characteristic variation in current density—in which a one zone or region of the traveling ion beam exhibits a decrease in current density (i.e., uniformity) while a neighboring zone or region of the beam exhibits the converse effect, an increase in current density. See for example, the systems described by U.S. Pat. No. 5,834,786, and the White et al. publication cited above.

In the above described application using method and apparatus for unscanned (ie., continuous) ribbon beams, the parallelism of the ion beam is deliberately degraded (by about +/−0.5 degrees) in order to achieve better uniformity of charged particles. It would theoretically be possible to reverse the tradeoff and achieve a very high degree of beam parallelism at the expense of uniform current density, but the individual parameters of beam parallelism and current uniformity cannot in general be simultaneously optimized. This is a marked disadvantage and obstacle for many ion implantation applications which require both a high degree of particle trajectory parallelism and excellent uniformity of current density.

It will be appreciated also that the commonly available scientific and patent literature provides an abundance of information concerning the marked differences between parallelism and uniformity as well as the tradeoff accommodations which must be made between them, in favor of one parameter over the other. Merely illustrative and representative of these printed publications are the following, each of which is expressly incorporated by reference herein: Berrian et al., U.S. Pat. Nos. 4,922,106 and 4,980,562; Enge, U.S. Pat. Nos. 4,276,477 and 4,745,281; White, U.S. Pat. No. 5,125,575, White et al., U.S. Pat. No. 5,350,926; White et al., U.S. Pat. No. 5,834,786; Iwasawa, U.S. Pat. No. 6,313,474; Aoki, U.S. Pat. No. 6,160,262; and Isobe, U.S. Pat. No. 5,180,918.

For these reasons, were a new development to be made which would allow the parameters of parallelism and uniformity to be concurrently optimized for a scanned ion beam, it would be seen as solving a long-recognized problem and as being of major benefit to practitioners working in the technical field today. Moreover, if such a new development could also provide for two entirely independent controls—which would allow the parallelism of a scanned ion beam to be controlled separately and independently from the beam's current uniformity, this improvement would be acknowledged as being an unexpected advance and as being of unique benefit and advantage for the users of ion implantation devices and systems generally.

SUMMARY OF THE INVENTION

The instant invention has multiple aspects and elements. A first aspect is for an ion implantation apparatus including a source for the generation of charged particles as an ion beam, a scanner which deflects the ion beam through a varying angle to yield a scanned ribbon beam, and a plane surface for the implantation of charged particles in the scanned ion beam into a workpiece which is moved through the scanned beam, the improvement of a fine-control collimator for accurate collimation and alignment of scanned beams, said fine-control collimator being comprised of:

first and second multideflector sequence arrangements symmetrically encompassing the width of the scanned ribbon beam, wherein each said multideflector sequence arrangement comprises (1) a linear support bar comprising ferromagnetic material and having a fixed length and girth, and (2) at least two coil deflectors wound independently and positioned adjacently at pre-chosen sites on said support bar, each of said coil deflectors being formed of electrically conductive wire and being wound to lie orthogonally to said support bar, and (3) at least a pair of steering coils wound independently and positioned individually at each end of said support bar;

first on-demand controls for passing electrical energy of variable current independently and concurrently through each adjacently positioned coil deflector on each of said support bar of said first and second multideflector sequence arrangements, whereby
(a) each adjacently positioned coil deflector becomes energized,
(b) each energized coil deflector independently generates a magnetic potential gradient of limited breadth aligned with the long axis of the linear support bar, which gives rise to an orthogonally extending magnetic field between said linear support bars, the magnetic field having a gradient where the lines of induction intersect the deflector coil, and being substantially uniform in the remainder of the space between the support bars,
(c) a plurality of said magnetic fields collectively form a contiguous magnetic field orthogonally extending between said first and second multideflector sequence arrangements, and
(d) each adjustable local magnetic potential gradient within said contiguous magnetic field can be individually and concurrently altered at will to yield a pre-selected magnetic field gradient profile which extends over the linear length of said support bars;

second on-demand controls for passing electrical energy of variable current independently and concurrently through each said steering coil positioned at the ends of each said support bar whereby said steering coils become energized and generate an orthogonally extending magnetic field between the support bars and an adjustable local magnetic potential gradient along the length of each steering coil;

a spatial channel bounded by said multideflector sequence arrangements for applying a contiguous magnetic field and a pre-selected magnetic field gradient profile to a scanned ion beam traveling therethrough, wherein the parallelism for a scanned ion beam becomes finely controlled and more accurate.

A second aspect of the invention is a method of improving ion beam collimation in a hybrid-scan ion implantation system which includes an ion source, an analyzer magnet, a beam scanner scanning the beam within a plane, a coarse collimation device for converting the scanned beam into an approximately- parallel scanned ribbon beam, and a plane mechanism for passing a workpiece through the scanned ribbon beam in a direction generally orthogonal to the direction the beam is scanned and implanting a substantially uniform dose of ions into the workpiece held at that plane, said improved collimation method comprising the steps of:

defining a reference axis of parallelism in a known orientation relative to the plane at which the workpiece is to be implanted with a dose of ions;

measuring the error in the direction of the beam centroid with respect to said reference axis within the plane at which the beam is scanned;

generating a controllable region of magnetic field and an adjustable magnetic field gradient profile in a direction substantially orthogonal to the plane in which the beam is scanned; and adjusting the magnetic field gradient profile in response to said error measurement of beam centroid direction; and applying said adjusted magnetic field gradient profile across the breadth of the beam such that said errors in the direction of the beam centroid are substantially eliminated relative to the plane at which the workpiece is to be implanted.

A third aspect of the invention is a method of concurrently improving both the collimation and the uniformity of the scanned beam in a hybrid-scan ion implantation system which includes an ion source, an analyzer magnet, a beam scanner to which a waveform is applied in order to scan the beam within a plane, a coarse collimation device for converting the scanned beam into an approximately- parallel scanned ribbon beam, and a plane mechanism for passing a workpiece through the scanned ribbon beam in a direction generally orthogonal to the direction the beam is scanned and implanting a substantially uniform dose of ions into the workpiece held at that plane, said improved collimation and uniformity method comprising the steps outlined above, plus the additional steps of:

after applying said adjusted magnetic field gradient profile across the breadth of the beam such that said errors in the direction of the beam centroid are substantially eliminated relative to the plane at which the workpiece is to be implanted, measuring the average dose rate per unit length across the breadth of the scanned beam;

modifying the waveform that is applied to the beam scanner in response to the measured dose rate such that the errors in dose rate relative to a pre-defined desired dose profile are substantially reduced.

BRIEF DESCRIPTION OF THE FIGURES

The present invention is better appreciated and more easily understood when taken in conjunction with the accompanying drawing, in which.

DETAILED DESCRIPTION OF THE INVENTION

Figure 1:
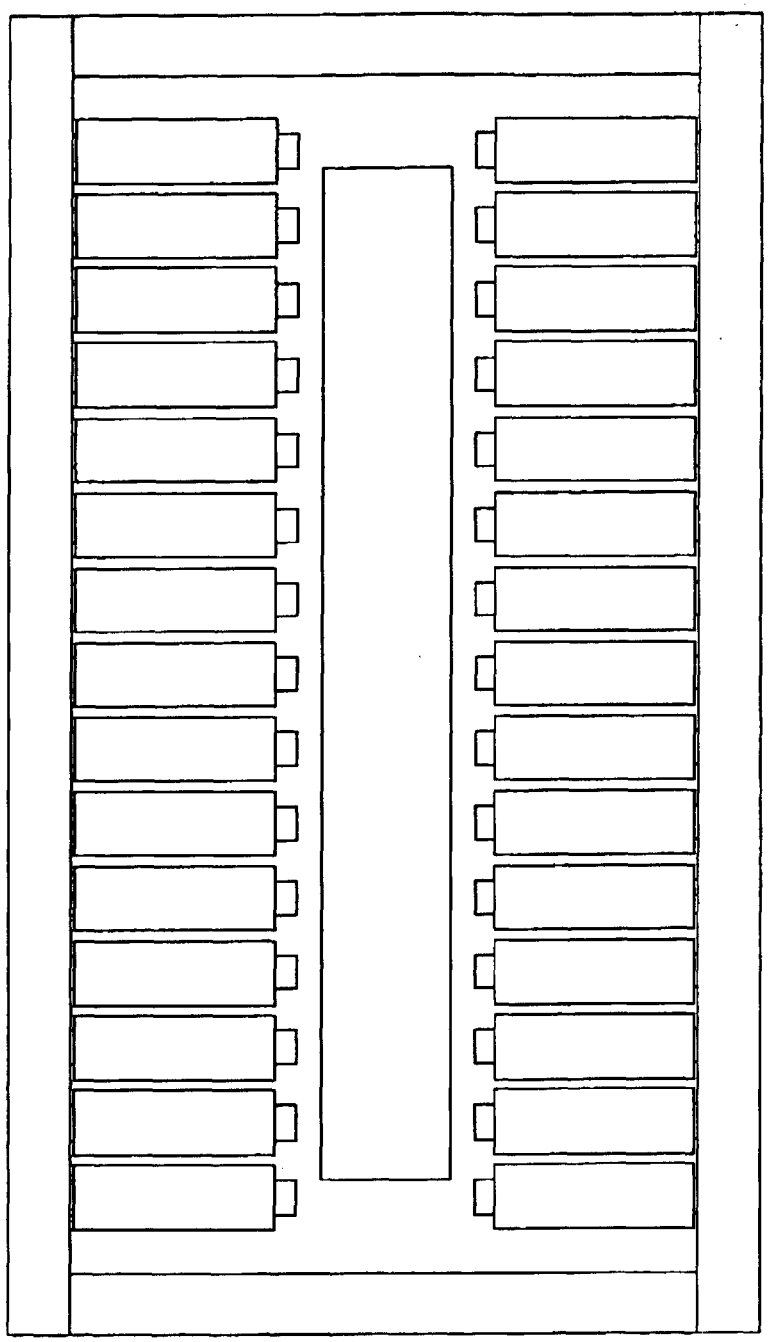
FIG. 1 shows a prior art Cartesian multipole lens used for controlling the uniformity of continuous ribbon beams.

The present invention comprises a method for accurate collimation and parallel alignment of a scanned ion beam;

and provides an unique precision instrument, a fine-control collimator, for accurately adjusting and controlling the parallelism of the trajectories for the charged particles in a scanned ion beam.

Conventionally known and previously existing hybrid parallel-scanned ion implantation apparatus and systems typically have a device which functions as a coarse collimator and which generates approximately parallel ion trajectories for the charged particles in the scanned beam. The present invention provides precision refinements and fine controls for improving the parallelism of scanned beams in such ion implanters and systems, in which:

(i) A reference axis of parallelism is defined, whose orientation and alignment with respect to the implantation plane for the silicon wafer (or other substrate) is accurately known;

(ii) The angle direction of travel of the approximately-parallel scanned ion beam is measured with respect to this reference axis of parallelism as a function of its scan position, in two different directions, each of which lies orthogonal to the direction of beam travel;

(iii) A spatially varying magnetic field and one having an adjustable magnetic field gradient profile is set up, using either a separate and independent discrete device or an integrated feature built into the structure of an existing coarse collimator, which corrects the trajectories of the charged particle trajectories such that the beam centroid then travels in the desired direction with substantially greater accuracy and precision than was previously possible;

(iv) Variations in the angular spread of the beam (as it is scanned) are eliminated to a great extent by suitable design of the coarse collimator device; and optionally, a second fine-control device may be used in combination with existing coarse collimators and the first fine-control collimator device to achieve a further reduction in these variations;

(v) The spatial profile of the ion dose delivered by the scanned beam at a pre-chosen rate to the target plane is evaluated; and the waveform created to scan the beam is modified in order to minimize deviations from a desired profile (which can be either a uniform or non-uniform pattern).

One particular aspect of the present invention, the method, can be used to improve the accuracy and control of ion implantation process parameters within a hybrid-scanned ion implanter. Specifically, the present methodology improves the control for the angle of incidence of the ions at the different locations across the surface of the wafer (or other substrate) and the consistency of the ion dose. In summary, the method comprises: measuring the error in the direction of the scanning ion beam relative to the intended angle direction of ion implantation as a function of x-axis coordinates; correcting the measured error in angle direction for the beam; and modifying the scan waveform to achieve the desired doping profile (as either a uniform or non-uniform pattern).

It will be noted and appreciated that one manipulative step of the method—correcting the measured errors in the beam direction—requires the practitioner to have a precision instrument and a fine control of a spatially varying magnetic field, which is applied to the scanned ion beam preferably after the beam has been coarsely collimated. The required magnetic field has the following characteristics:

i) The magnetic field component $B_y$ varies with the x-coordinate. But it is essentially independent of the y-coordinate. This field component can be used to correct errors in x';

ii) The magnetic field component $B_x$ can be controlled in magnitude and in sign, but is uniform along the x-direction. This field component can be used to correct an overall error in y'.

Maxwell's equation for J tells us that, in a vacuum, $$dB_y/dx - dB_x/dy = \mu_0 J_z$$

and since $J_z$ is negligibly small (with regard to the current needed to sensibly cause any change in direction of the ion trajectories), one can approximate it by zero. Therefore variations in $B_y$ cause undesirable variations in $B_x$.

In addition, one can arrange that $B_x$ is constant, at least on the midplane, by ensuring that the device used to create the $B_y$ field is mirror-symmetric in the plane y=0. However the device that creates the uniform $B_x$, component must break this symmetry.

This spatially varying magnetic field can be effectively and finely controlled by any of several devices including: (i) specific adaptations and modifications of at least two conventionally known 'multipole lens' devices (which, however, cannot control all the field components fully independently); and (ii) a novel and unique fine-control precision instrument referred to herein as a 'Fine Collimator/Steerer', some details of which are given below.

The 'Fine Collimator' is a precision instrument which is intended to be used within a range and variety of different, but conventionally known, ion implantation apparatus and systems which use scanned ion beams; and is a structural assembly employed to reduce the trajectory deviation of a scanned beam from a desired direction and angle by increasing the parallelism of the charged particles of the beam.

Among the features and capabilities provided by the precision instrument of the present invention are the following:

a. The fine collimator will achieve a reduction of the non-parallelism of scanned ion beams;

b. The method of using the fine collimator will modify the scan waveform (in order control the average current density) of a scanned ion beam which has been rendered accurately parallel;

c. The fine collimator will achieve substantially independent control of the parallelism and the density uniformity of a scanned ion beam, thereby making possible extremely accurate process control in the manufacturing by ion implantation of semiconductor devices on large (300 mm) silicon wafers and other substrates;

d. The fine collimator will achieve control of the parallelism of a scanned ion beam in two orthogonal directions (i.e., the x- and y-axes) as the scanned ion beam travels in its intended pathway and direction (i.e., in the z-axis);

e. The fine-control collimator will provide control of the variation of the spread in angles $\Delta y'$ as a function of the beam's x-axis coordinate.

I. Definitions

In order to avoid inconsistencies in terminology, eliminate ambiguities in denotative and connotative meanings, and increase the clarity and completeness of comprehension and understanding, a set of carefully recited definitions is presented below. These terms, nomenclature and jargon presented below will be employed consistently and repeatedly herein to describe and claim the present invention in a manner that not only sets forth what the present invention is and how it is to be made and used, but also differentiates and distinguishes the inventive subject matter from what it is not.

Ion beam: Any beam of charged particles, including electrons, positive or negative ions, molecules, clusters, or subatomic particles.

Ribbon beam: An ion beam having a cross section characterized by a long dimension and a short dimension, the long dimension being at least twice the short dimension, and usually at least five times the short dimension. The long dimension is usually larger than a dimension of the face of the workpiece to be processed with the beam Scanned ribbon beam: A beam (typically circular or elliptical) which is scanned in a plane within a ribbon-shaped envelope, and at any one point in the envelope, the beam will be interrupted twice in each scan. (In contrast and distinction, a continuous ribbon beam is one in which the current at any point is uninterrupted for at least the time required to process one workpiece).

x, y, and z coordinates (or axes): The z coordinate (or axis) is the intended direction of travel for the ion beam. The x-coordinate (or axis) is aligned with the larger or wider cross-sectional dimension of the intended beam. The y-coordinate (or axis) is aligned with the smaller or narrower cross-sectional dimension of the intended beam.

x': The angle measured from the z-direction projected onto the x-z plane. This angle is used to refer to the direction of the beam centroid.

y': The angle measured from the z-direction projected onto the y-z plane. This angle is used to refer to the direction of the beam centroid.

$\Delta x'$: The half-width of the distribution of angles within the beam about its centroid, projected onto the x-z plane $\Delta y'$: The half-width of the distribution of angles within the beam about its centroid, projected onto the y-z plane Downstream: The travel pathway or the targeted angle and direction of the ion beam.

Upstream: Opposite to the travel pathway or 180 degrees from the targeted angle and direction of the ion beam.

Controlling the uniformity of a scanned ion beam: Maintaining a desired current density along the long transverse dimension of the scanned beam in adherence to a desired profile.

Controlling the parallelism of a scanned ion beam: Adjusting and aligning the individual trajectories of charged particles of a scanned beam such that they become substantially spatially equidistant from one another.

Coarse Collimator: A structure or device conventionally known in the technical field which renders the trajectories of charged particles in an ion beam approximately parallel.

Fine Collimator: A structure (including modifications of conventionally-known structures) capable of providing fine control of errors in collimation of a scanned beam, as a function of position in the scan, and rendering the beam more accurately parallel.

II. Modified Devices Able to Improve Beam Parallelism

Modifications for Devices Conventionally Known in the Art:

Using the definitions and terminology given above, the intended travel direction of an approximately-parallel scanned beam is in the z-axis direction, and the ion beam is intended to lie with its centroid in the plane y=0. Provided all the upstream ion optical components are symmetric in the plane y=0 (which is typical), any error in y' should not vary as a function of x. (Such variation can arise if there is a rotational misalignment in the upstream components breaking the symmetry, but this is deemed to be an unlikely static defect which can be repaired). However, it is probable that errors in x' will vary as a function of x, since they can be caused by manufacturing or design defects in the coarse collimator device.

Furthermore, if the coarse collimator device employed in the implantation system is in the form of a dipole magnet, it is probable that the quantity $\Delta y'$ will vary as a function of x; and, indeed, this is known to be the case for presently existing hybrid scan ion implanters. This is a textbook second-order aberration. A full explanation of this aberration, and of the symmetry arguments, can be found in many authoritative texts, including the appendix to TRANSPORT [by Brown, Rothacker, Carey and Iselin] published variously by SLAC, CERN and other agencies, and as exemplified by CERN report 80-04. This second-order aberration can be corrected, but only in the ion optical design stage, and not solely by means of an add-on device. The program TRANSPORT may also be used to design a system in which this aberration is controlled.

A First Modified Construction

A first candidate able to be structurally modified as a 'fine collimator' is the prior art device shown by FIG. 1. This device can be electrically excited in a manner that is mirror-symmetric, and is capable of generating the spatially varying $B_y$ components. As shown by FIG. 1, the device has a symmetrical paired set of simple electromagnets presented as a row of wire-wound ferromagnetic poles set above and below the beam, which are mounted to a surrounding ferromagnetic yoke. With a resolution determined by the pitch of its multiple poles, this device can create an arbitrary spatially varying magnetic field in the y-axis direction. However, the device of FIG. 1 does not intrinsically generate a uniform x-axis component of magnetic field.

This desired feature and capability, however, could be generated separately by the addition of a magnetic beam steering apparatus; or, alternatively, by modifying the conventional structure to incorporate additional electrical coiled windings suitable for this purpose.

A Second Modified Construction

Figure 2:
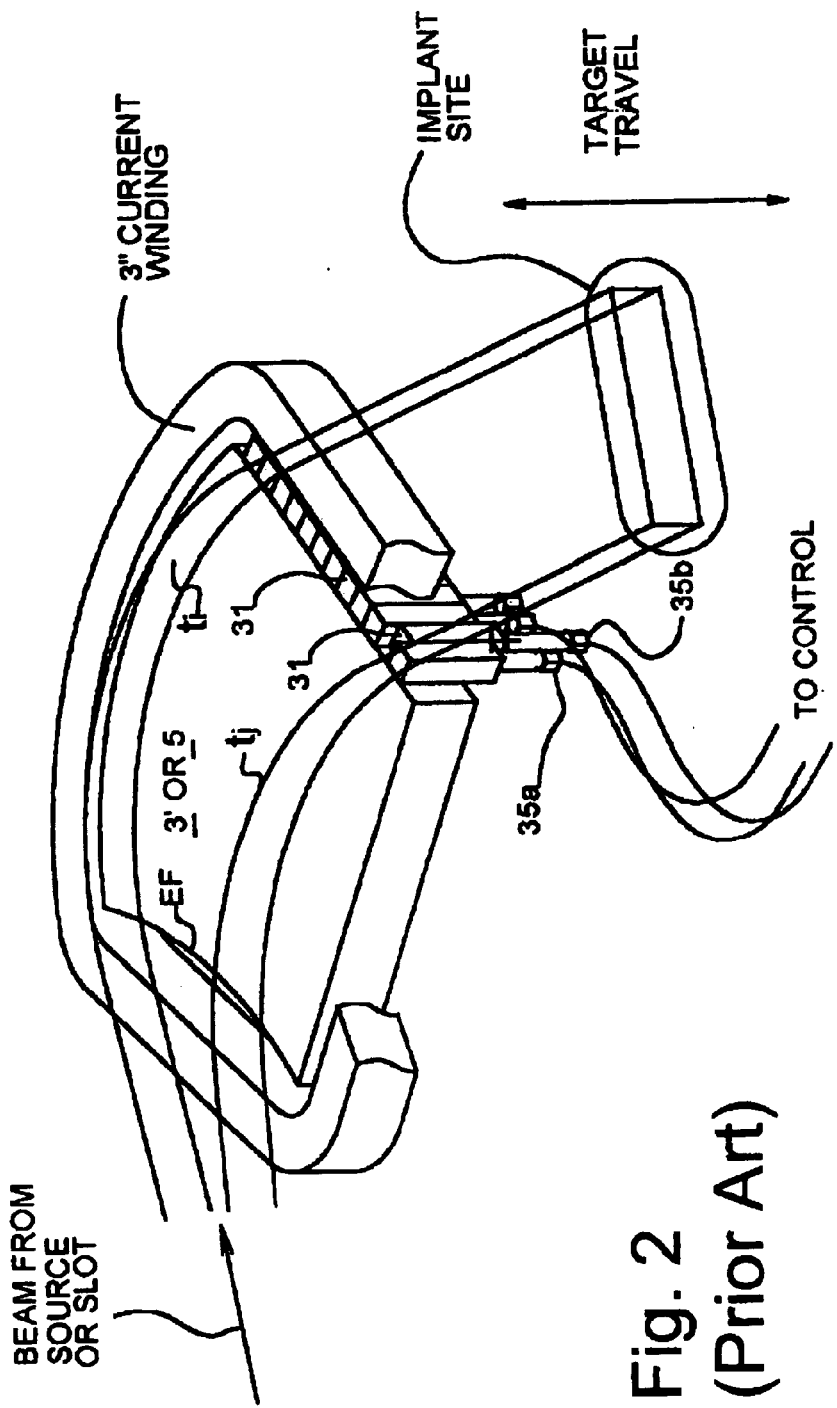
FIG. 2 shows a sectional view of a prior art collimator magnet whose pole contains movable ferromagnetic rods.

Another conventionally known device which can be structurally modified to function as a 'fine collimator' and then generate the y-axis component of the varying magnetic field is shown by FIG. 2. Presuming that the ion implanter system uses a dipole magnet to achieve coarse collimation for the scanned ion beam, then the necessary modification is that one or more sets of movable rods be installed in one or both poles, thereby creating a spatial zone in which a varying $B_y$ component is superimposed on the static $B_y$ component, which deflects the ion beam through a total angle of (typically) between 30 and 90 degrees. This spatial zone can achieve the desired improvement in parallelism and fine collimation in the x-axis direction. Symmetrical arrangements minimize unwanted variations in $B_x$; but, in particular instances, asymmetrical arrangements may be acceptable. However, a separate device to remove y' errors is again required in all asymmetrical structures.

It will be recognized and appreciated, therefore, that although the structures and devices illustrated by FIGS. 1 and 2 respectively are conventionally known and commonly used, the structural modifications described herein and the adaptation and use of the modified constructions have not previously been conceived, or considered, or functionally employed.

III. A Preferred Fine-control Precision Instrument

Figure 3:
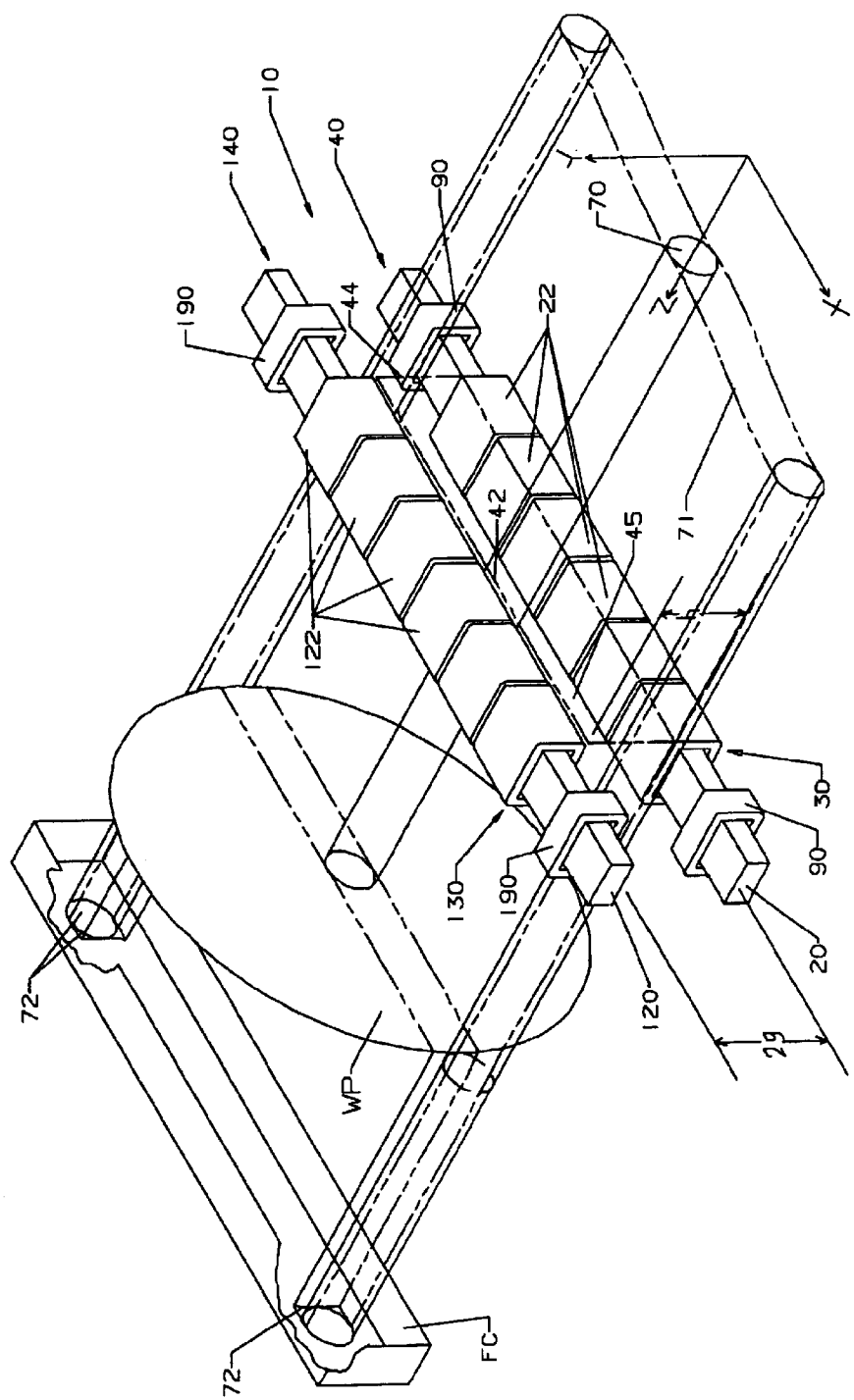
FIGS. 3 and 4 show a perspective view and a cross-sectional view looking in the direction of the beam of a fine-control collimator/steerer construct suitable for correction of parallelism in a charged particle beam in accordance with the present invention.
Figure 4:
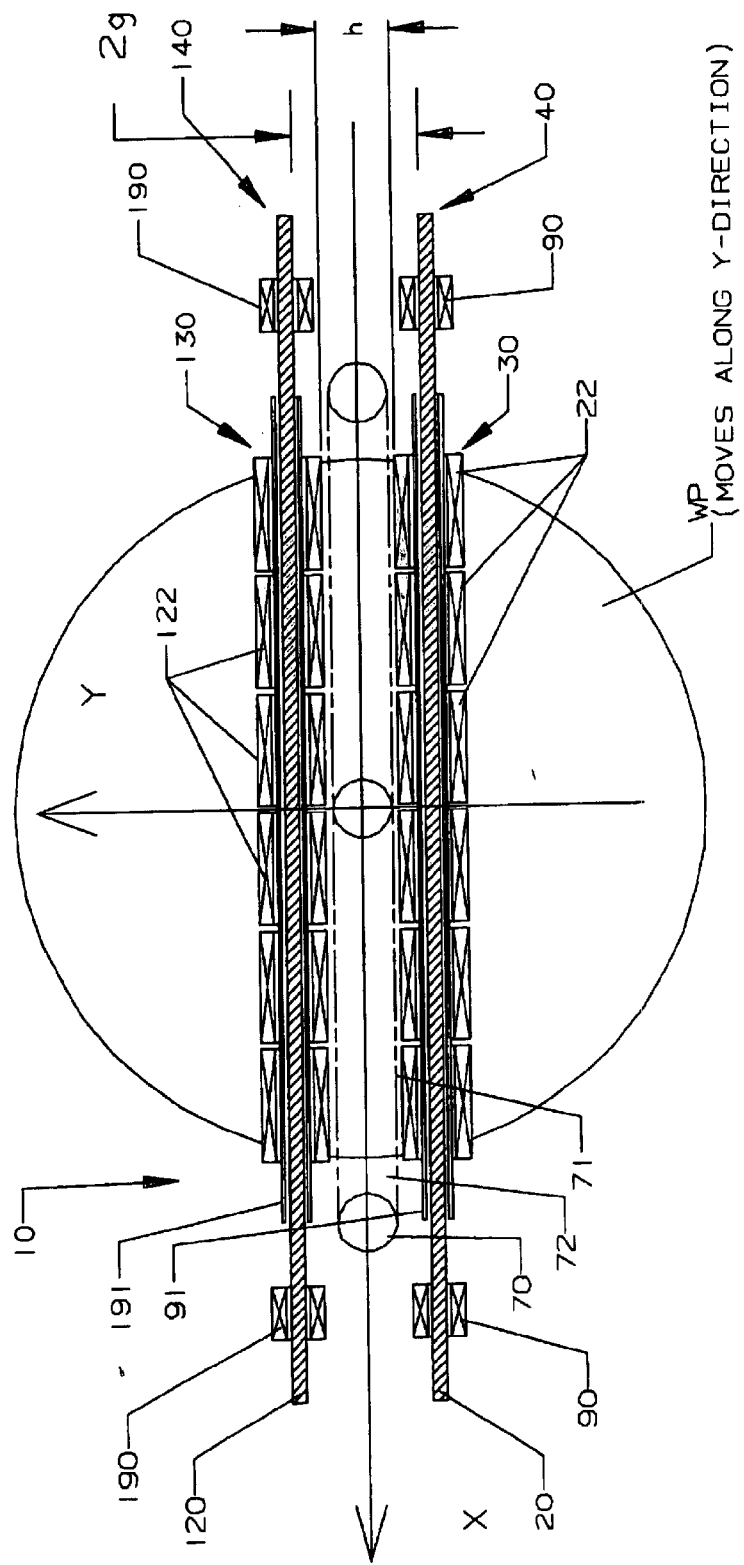

An important aspect of the present invention is the novel and unique precision instrument and preferred embodiment of the fine-control collimator, as is illustrated by FIGS. 3 and 4 respectively. The fine collimator/steerer is situated upstream from the workpiece WP, which is to be implanted with the beam ions at a target plane TPI. As seen therein, the fine collimator/steerer 10 appears as two substantially similar subassemblies 40 and 140, each of which is spaced from the other at a pre-chosen gap distance. Within the two subassemblies 40 and 140 are two ferromagnetic bars 20 and 120, each of which is linearly sized to be somewhat longer than the x-axis or breadth dimension of the scanned ion beam 71; and each bar 20 and 120 is oriented to lie parallel to and at a pre-chosen gap distance 44 from the other.

Each ferromagnetic bar 20 and 120 serves as a linear support around which a plurality of individual wire windings are orthogonally placed at a number of predetermined and different locations as coil deflectors 22 and 122. Each ferromagnetic bar and its multiple wire windings thus form an axially aligned series of independent, separated, and adjacently located coil deflectors 22 and 122; and these cascades of deflectors in sequence collectively result in and form the first multideflector sequence arrangement 30 and the second multideflector sequence arrangement 130 respectively. The collimator construct 10 thus comprises both the first and second multideflector sequence arrangements 30 and 130, which are positioned to lie in parallel, are oriented along a commonly shared x-axis direction, and lie in mirror-image symmetry about the plane y=0.

Note that the total number of coil deflectors arranged in series on a ferromagnetic bar and constituting each multideflector sequence can vary substantially, and typically will depend on the expected circumference or girth of the scanned ion beam. Nevertheless, each multideflector sequence should comprise at least two (2) adjacently located coil deflectors, and often will have between four (4) and thirty (30) adjacently located coil deflectors positioned in sequence upon a straight ferromagnetic bar.

Each coil deflector 22 is typically electrically joined in common with its directly oppositely-situated and corresponding counterpart coil deflector 122. Each set of opposing and corresponding deflectors is thus electrically connected as a matched pair, one deflector of the pair lying on each side of the spatial passageway 45, with the electric current flowing around each wire winding of the pair in the opposite angular direction (as if reflected in the symmetry plane).

It is preferred that the pitch of the coil deflectors across the breadth dimension 42 of the spatial passageway 45 should be less than "g" for optimum control; but since the number of independent power sources typically increases as the pitch is reduced, so too the overall cost and the degree of wiring complexity become powerful considerations when deciding upon the total number of deflectors. Furthermore, it may be determined by empirical experiment that if the error variation of parallelism is sufficiently small for a particular construct or embodiment, that a relatively large pitch for the individual coil deflectors becomes acceptable.

Figure 5:
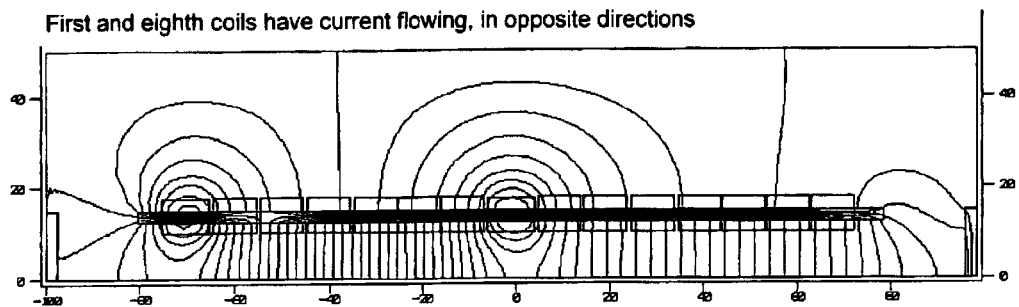
FIG. 5 shows the magnetic field profile caused by exciting individual pairs of wire deflectors.
Figure 6:
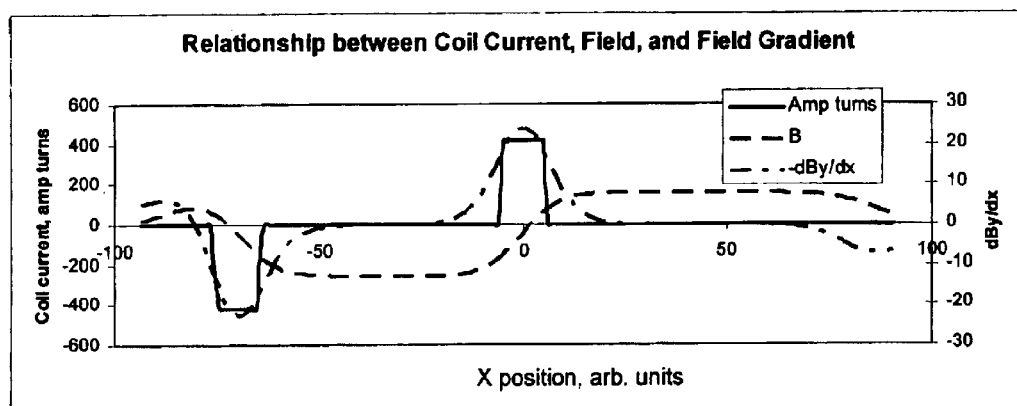
FIG. 6 shows the magnetic field gradient caused by exciting individual pairs of wire deflectors.

The Generated Magnetic Fields:

Also included as part of the overall fine collimator/steerer assembly are on-demand electrical controls (not shown) for introducing and passing electrical energy of variable amperage independently through each individual and adjacently positioned coil deflector 22 and 122 which is orthogonally disposed along the linear length of the support bars 20 and 120. When provided with electrical energy of an appropriate or desired amperage, each adjacently positioned energized coil deflector 22 and 122 independently generates a magnetic potential difference of limited breadth and an individually adjustable magnetic field gradient which extends orthogonally from each ferromagnetic bar, the field having a controllable gradient in a region of limited breadth. The magnetic field is illustrated by FIG. 5 and the magnetic field gradient is shown by FIG. 6.

It is intended that each energized deflector generates a local magnetic potential difference over its coil width, a gradient of limited breadth orthogonal to the winding along the x-axis direction; and oppositely situated pairs of energized deflectors arranged in reciprocal series on the two ferromagnetic bars will create a plurality of local magnetic potential differences of limited breadth in opposing directions along the x-axis dimension of the construct. This result cumulatively and collectively creates a fixed spatial zone between all the oppositely-situated pairs of deflectors in which the $B_y$ field component changes—which then merges into two end regions of substantially constant field existing at each end of the support bars in the construct.

In this manner, the plurality of magnetic fields and adjustable magnetic field gradients generated by adjacently located pairs of opposing deflectors collectively sum to form a each magnetic potential difference of limited breadth contributing to the overall magnetic field gradient profile within the fixed spatial zone can be individually altered at will (by varying the electrical amperage) to yield an adjusted and controlled broad magnetic field which has a preselected gradient profile and extends effectively over the entire breadth of the ion beam.

The particular construction of FIGS. 3 and 4 generates within the rectangularly-shaped spatial passageway a magnetic field whose component $B_y$ changes smoothly—i.e., without abrupt differences. Excitation of a particular pair of oppositely-situated deflectors causes a change in $B_y$ to be generated across the space between the particular pair of deflectors, and causes a change in an otherwise constant field $B_y$ to be established in the spatial region on either side of this deflector pair. FIG. 6 illustrates the electromagnetic effect caused by individual deflector pairs.

The Encompassing Spatial Passageway Through which the Ion Beam Travels:

As illustrated by FIGS. 3 and 4, the aligned series of independently and adjacently placed coil deflectors 22 and 122, (positioned on the linear ferromagnetic bars 20 and 120 and forming the first and second multideflector sequence arrangements 30 and 130) are congruent with (i.e., coincide exactly when superimposed) and encompass the breadth dimension 42 of the spatial passageway 45 through which the scanned ion beam 71 travels in-situ. The multideflector sequence arrangements 30 and 130 are typically positioned by means of non-magnetic supports (not shown in FIGS. 3 and 4) to lie in parallel and in aligned correspondence such that a preset separation distance ("h") exists and is maintained between each pair of oppositely-situated coil deflectors 22 and 122. The preset separation distance ("h") typically defines and dimensions two of the sides of the rectangularly-shaped, fixed spatial passageway 45 into which the desired magnetic field is generated and applied to the traveling ion beam.

It is essential that the size of the pre-chosen gap distance 44 existing between the two subassemblies 40 and 140 should be properly understood and appreciated. Each ferromagnetic bar 20 and 120 provides a ferromagnetic limit and fixed boundary at which the magnetic field lines are constrained to be orthogonal. The bars 20 and 120 are separated by a fixed spatial distance "2g". The multideflector sequence arrangements 30 and 130, however, occupy a part of this distance, and thus their preset separation distance is "h". It will be recognized that "h" is always quantitatively smaller than the fixed spatial distance "2g". Therefore, the size of the pre-chosen gap distance 44 for the construct 10 will thus never be greater than the fixed spatial distance "h" and, in some instances (e.g., circumstances when vacuum walls intervene) may be significantly smaller than "h". In this manner, the spatial volume through which the charged particles of the scanned ion beam will travel (in the z-axis direction) is contained within and demarcated by the breadth distance 42 (representing the x-axis or wider dimension) and the pre-chosen gap distance 44 (representing the y-axis or narrower dimension) of the spatial passageway 45.

X-axis Steering Controls:

It will be noted also that two additional pairs of wire windings forming steering coils 90 and 190 are individually disposed near the discrete ends of each ferromagnetic bar in the assembly shown by FIGS. 3 and 4. These additional pairs of steering coils are independently connected to a source of electrical current in a manner similar to that of the coil deflectors 22 and 122, but the function of the steering coil pairs 90 and 190 is to provide overall x-axis steering control for the assembly. The pair of steering coils 90 at the ends of the bar 20 are electrically connected in common—but in opposing senses—such that the net ampere turns through the two coils 90 is always zero in value. Similarly, the pair of steering coils 190 located at the ends of the bar 120 are electrically joined in common along the plane y=0. The function of these sets of steering coils 90 and 190 is to provide overall linear steering control for the scanned ion beam in the x-axis direction. Accordingly, steering coils 90 and 190 are referred to herein as "x-axis steering coils".

Y-axis Steering Controls:

In some embodiments, the fine-control collimator optionally includes two thin-layer wire wrappings 91 and 191, which are shown only in FIG. 4. These thin-layer wire wrappings 91 and 191 are wound uniformly along and around substantially the entire linear length of each bar 20 and 120, and are located either within or over the cascade of adjacently placed coil deflectors forming the multideflector sequence arrangements. However, unlike all the coil deflectors, these two linear wire wrappings 91 and 191 are independently connected to a source of electrical current such that the amperage flow is antisymmetrical in the plane y=0. Accordingly, the intended function of these thin-layer linear wire wrappings is to provide the construct with the capability of controlling and steering the traveling ion beam in the y-axis direction; and thus are properly referred to herein as 'y-axis steering coils'.

Figure 7:
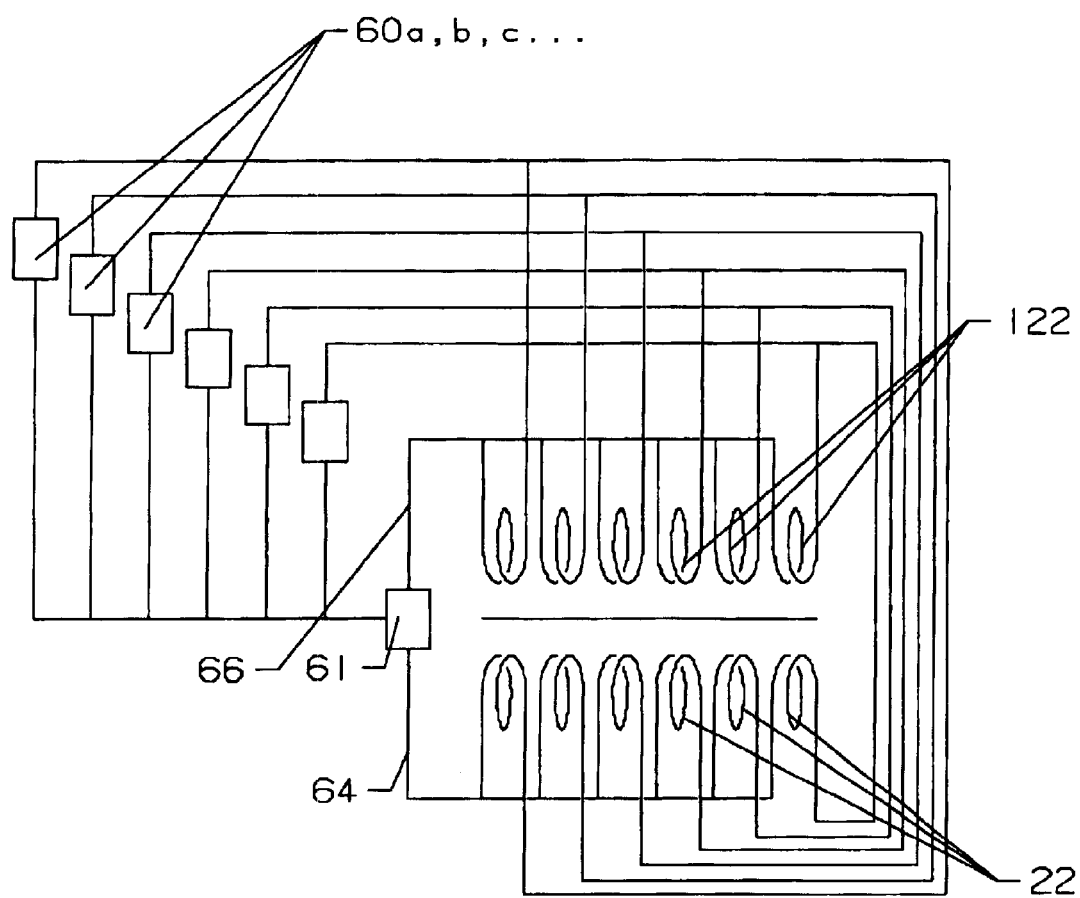
FIG. 7 shows a method of connecting the coil deflectors of FIG. 1 to allow y-axis steering control.

Another alternate and optional means of providing the fine-control collimator with y-axis steering capability, but without creating or using the thin-layer linear wire wrappings 91 and 191, is to pass an antisymmetric electric current—in addition to the commonly shared deflecting electric currents—through all the deflectors. This can be accomplished by means of the structural arrangement shown in FIG. 7.

As shown therein, a plurality of power supplies 60*a,b,c* are connected such that each supply provides electric current via a flow pathway which lies parallel to a particular matched deflector pair 22 and 122; but has a first commonly-shared current return line 64 from all the deflectors 22 and a second commonly-shared return line 66 from all the deflectors 122 which are individually connected to the terminals of a bipolar center-tapped power supply 61. By means of the power supply 61, a small additional potential difference is inserted between each pair of deflectors that are connected in parallel, and this potential difference unbalances the current flowing within each deflector pair. Within tolerances determined by the resistances of the individual deflectors, this arrangement generates a uniform x-axis directed field component capable of providing y-axis steering control for the construct. The use of the y-axis steering function and capability is described more fully below.

Using the Fine-control Collimator:

Using the fine collimator/steerer illustrated by FIGS. 3 and 4, an electrical current of known amperage is passed into each electrically joined pair of oppositely-situated deflectors (disposed upon the first and second multideflector sequence arrangements); and this amperage may be independently adjusted and controlled for each oppositely-situated pair of coil deflectors.

In addition, the individual pairs of oppositely-situated x-axis steering coils located closest to the ends of the ferromagnetic support rods may be positioned to lie just beyond the confines of the scanned ion beam width; and the end portions of each support bar can be increased in length beyond the last of the coil deflectors by a linear extension sufficient to ensure that the electromagnetic effects of the ferromagnetic bar ends on the distribution of the contiguous magnetic field (generated by the deflectors and applied to the scanned ion beam) are insignificant. The length of such bar end extensions will typically be at least twice the size of the pre-chosen gap distance separating the first and the second multideflector sequence arrangements. It is also essential that the support bars themselves must not be tangibly joined to ferromagnetic material or the generated magnetic field applied within the spatial passageway will become drastically altered from its intended distribution.

In addition, if ferromagnetic material is used to connect the ferromagnetic support bars at their individual ends to form a complete magnetic yoke (as in some conventionally known devices), then it is essential to add one or more additional large wire windings (deflectors) on these short ends which will carry electric currents equal to the algebraic sum of the currents in each multideflector sequence arrangement, but in an opposing sense. In the preferred embodiment, the ferromagnetic material and its extra coils linking the ends are omitted; and the resulting effect on the central magnetic field profile is insignificant, provided that the linear support bars extend well beyond the width of the traveling ion beam. The stray magnetic field existing at some distance from the arranged structure is somewhat greater in effect, but this flaw can be controlled with magnetic shielding, the discussion of which is outside the scope of this invention.

Near the ends of the bars, the magnetic field gradient falls to zero and then reverses; for this reason, the ends of the support bars must be located beyond the region in which the desired magnetic field profile is to be maintained. This premise and approach assumes that sufficient ferromagnetic material (e.g., iron or steel) is present in the remaining two ends of the support bars such that this material does not magnetically saturate; and this factor determines the maximum x-axis dimensional extent and excitation level of the fine-control precision collimator construction.

Electrical Requirements:

The electrical requirements of the fine-control collimator construct may be calculated in the following manner. The magnetic field required to deflect an ion of mass M, charge q and kinetic energy U on a trajectory with a radius ρ is given by $$B\rho = \frac{\sqrt{2\,mU}}{q}$$

Assume that the z-extent of the fine collimator construct is defined by the overall z-extent of the deflectors—in reality this may be slightly less and could be modeled with a finite element computer code for accuracy. This dimension is named $L_m$ and is not tightly constrained; for practical reasons we can assign it a value of 100 mm. Therefore, the angle through which a given field B would deflect an ion of mass M passing though a device of effective length $L_m$ is $$\theta \approx L_m B \frac{q}{\sqrt{2\,MU}}$$

One must have some prior knowledge of the likely magnitude of the angular errors in the beam, and of the characteristic distance over which these errors vary. For the present purposes (based on very conservative interpretations of measurements on existing implanters), one can assume that variations of 0.45 degrees (0.01 radians) could arise over a distance of 50 mm, and we choose to make the width w of each deflector equal to 50 mm. It follows that six deflectors on each bar are sufficient for an implanter for 300 mm silicon wafers.

Assume further that the ionic charge is constant and that the ions are accelerated through a total DC potential V. The maximum change in $B_y$ required from each deflector is then given by $$|B_y| < \frac{0.01}{L_m}\sqrt{\frac{2\,MV}{q}}$$

The total gap between the ferromagnetic bars is 2g. The number of ampere-turns in each coil nI is given by $$nI < \frac{0.01\,g}{\mu_0 L_m}\sqrt{\frac{2\,MV}{q}}$$

IV. The Intended Locale for and Purposes of the Fine-control Collimator

Intended Locale:

A proper setting and intended environment for the present invention is within a hybrid scanning ion implantation apparatus and system. By definition and structure, such devices typically comprise: a source ("S") of charged particles traveling as an ion beam ("IB"); at least one dipole magnet (not shown) for separating a desired species of ions from impurity species; a scan device ("SD") for scanning the charged particles and generating a scanned ion beam ("SIB"); a coarse collimator ("CC") device (which may or may not be formed as a dipole magnet) for rendering the scanned beam approximately parallel or within about +/−1 degree; a single, large Faraday cup ("FC"); and a targeted plane for implantation ("TPI") suitable for introducing the charged particles of the scanned ion beam into a prepared workpiece ("WP"), such as a silicon wafer, which is passed orthogonally through the scanned beam—i.e., in the y-axis direction.

In all instances, the fine-control collimator comprising a part of the instant invention is intended to be used solely and exclusively with the charged particles of a scanned ion beam to improve their collimation. This is shown by FIGS. 8 and 9 respectively.

Figure 8:
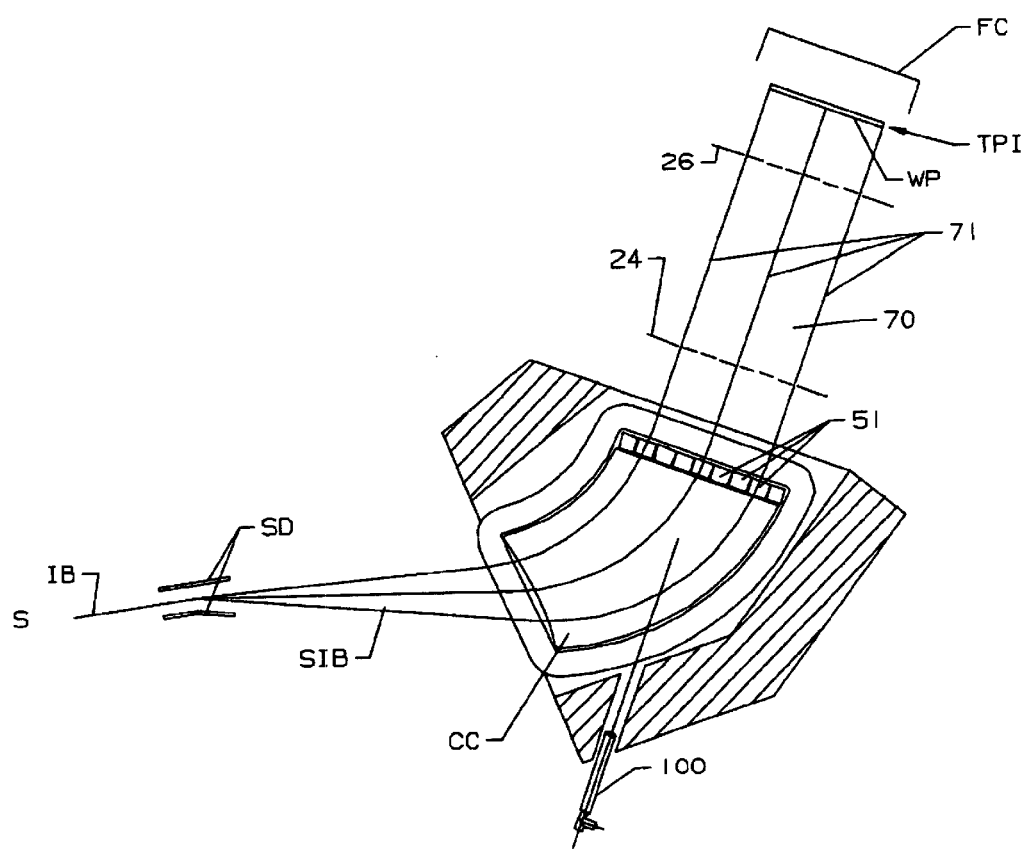
FIG. 8 shows a general layout of the scanning and implanting section of a first conventionally known ion implantation system which can be modified to include a fine-control collimator of the present invention.

FIG. 8 illustrates the conventional use of a coarse collimator device in the form of a dipole magnet within a previously known hybrid scanning implantation system, but this now has a fine-control collimator portion 51 (formed of movable pole pieces) installed at the dipole magnet's point of exit. This improved arrangement results in a system capable of correcting errors in collimation in x', but would require an additional device or other correction means in order to rectify errors in y'.

Figure 9:
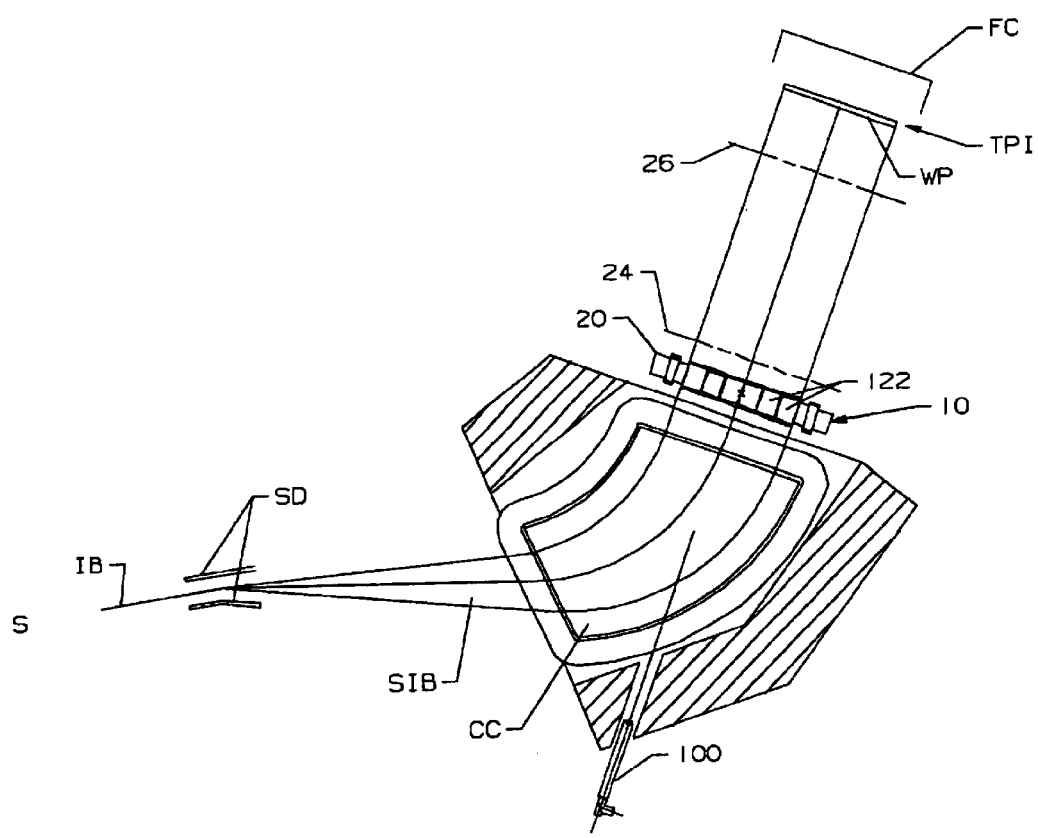
FIG. 9 shows a general layout of the scanning and implanting section of a second conventionally known ion implantation system which can be modified to include a fine-control collimator of the present invention.

FIG. 9 illustrates the alternative placement and use of a fine-control collimator/steerer as a discrete and independent construction located adjacent to the coarse collimator (dipole magnet) in order to provide fine collimation for the implantation system—i.e., to remove substantially the remaining errors in both x' and y'.

Purposes and Goals:

The purposes and goals of the unique precision collimator construct comprising a part of the instant invention may be more easily understood and better appreciated with reference to the coordinate system framework identified above, and are as follows:

(i) The time averaged current per unit length in the x-axis direction is typically desired to have a tightly controlled ion density profile, usually uniform, but under some circumstances deliberately non-uniform.

(ii) The beam direction is typically desired to be constant. Thus, the ion beam is "parallel scanned"; and it is desired to tightly control the parallelism and alignment of the charged particle trajectories in the z-axis direction.

(iii) It is desired that the instantaneous shape of the beam be independent of the x-axis coordinate of its centroid.

V. The Mode and Manner of Increasing and Controlling Parallelism

The following discussion of the mode and manner for increasing and controlling parallelism of a scanned ion beam speaks mainly to error variations in the direction of the local centroid of the beam trajectories with respect to the z-axis—and only concerns or addresses the total included angular spread within the beam when this is clearly specified.

Under certain circumstances, the residual angular errors, x' and y', of the scanned beam centroid are large enough to affect the ion implant process, and a further reduction and positive control of these angular errors is desired. Typically the magnitude of these errors is less than 1 degree; and it is often desirable to reduce them to 0.1 degrees or less. Control in both the x-axis and y-axis directional planes is desirable.

It will be recalled that the preferred fine-control collimator construct comprises two ferromagnetic bars which are mounted across the width of the beam on either side of it, and approximately in the plane z=0. A regular sequence of discrete and separate deflectors is disposed around each linear ferromagnetic bar; and each individual deflector located on the first bar lies opposite to and across from a corresponding deflector on the second bar. Corresponding pairs of oppositely situated deflectors forming the multideflector sequences may be optionally electrically connected either in series or in parallel.

The number of coil deflectors disposed upon each bar depends on the dimensional proportions of the scanned beam of interest as well as upon the expected degree of relative non-parallelism then present within the scanned ion beam. In one preferred embodiment, the number of coil deflectors on each ferromagnetic support bar is six (6). An additional pair of x-axis steering coils placed adjacent to the ends of the support bars is desirably provided for the reasons described previously herein. Alternatively, additional wire windings for x-axis and y-axis steering control may be present as previously described herein, if and when these features are deemed to be either useful or necessary.

Also, it is preferred that separate electric power supplies will excite each corresponding pair of oppositely situated deflectors in the fine-control construct. Optionally, and in the alternative, separate and independent power supplies will excite each individual deflector in sequence within the linear sequence cascade of coil deflectors, for reasons expounded below.

The total number of wire turns forming a deflector depends on the magnitude of the expected errors and on the magnetic rigidity of the ion species encountered. This quantity is proportional to the square root of the product of the mass and energy of the ions. A typical count of wire turns for a coil deflector is 100 in number.

Magnetic Field Gradient Adjustments:

In general, the scanned ion beam is directed to impinge on a chosen target at a set distance (Z) downstream from the fine-control collimator. It is preferable to control the parallelism of the ion beam along its x-dimension in the plane z=Z. From a measurement of the pre-existing non-parallelism of the ion beam, it is possible to calculate a specific magnetic field profile, $B_y(x)$, which is to be applied transversely to the traveling beam and which will result in appropriate correction of the non-parallelism for the beam.

For the preferred fine-control collimator, it is helpful to compute the differential within the desired magnetic field profile and obtain a magnetic field gradient report, $dB_y/dx$— from which a desired setting (amperage) of the electric currents to be introduced individually into each of the coil deflectors of the multideflector sequence arrangements may more directly be calculated. There is a simple correspondence between the electric current passed into each pair of oppositely situated deflectors in the multideflector sequence arrangements and the magnetic field gradient, $dB_y/dx$, on the mid-plane of the beam envelope passing between each pair of coil deflectors.

The overall beam x' direction requires one further adjustment, which may be provided by the x-axis steering coils (or alternative steering coils features) described above to cause changes beyond that portion of the spatial zone occupied by the traveling beam; and which therefore has the effect of superposing a uniform dipole field in the y-axis direction on the entire beam. Alternatively, the same effect may be accomplished by a small adjustment to the magnitude of the field in the modified coarse collimator (or modified dipole magnet), where one is used.

Accordingly, if there are $\phi$ pairs of oppositely situated deflectors, then the existing error in parallelism may be corrected at $\phi$ discrete points in the beam, and this will require $\phi$ independent adjustments. However, in actual practice, it appears that one needs to correct the parallelism at $\phi E \Theta$ points. This ostensible discrepancy in the number of correction points is easily resolved by selecting the central trajectory of the beam (the beam centroid) as the reference standard for adjusting parallelism; by then correcting all other charged particle trajectories to lie parallel to the central trajectory; and then separately correcting the traveling direction of the beam as a whole using the x-axis steering coils (or alternative steering control means) such that the central trajectory has zero error in x'. When all $\phi+1$ points have been corrected, the residual errors at locations between the points can be expected to be small, as well as to be proportional to the square of the widths of the deflector coils. The finite width of the deflector coils determines the precision with which $dB_y/dx$ can be made to conform to the ideal profile. In this manner, the reduction in non-parallelism that is achievable is proportional to $1/\phi^2$.

Overall Effects And Results:

It is important to note that the increase in beam parallelism which can be achieved by different embodiments of the fine-control collimator will substantially modify the integrated consistency of doping for the scanned beam; and, in general, the uniformity of charged particle density may be either better or worse after accurate collimation of the scanned beam. This mode and manner of parallelism correction using the present collimator construct is thus markedly different and distinct from conventionally known devices whose explicit and intended purpose is solely and exclusively to improve ion beam uniformity.

In addition, when using the present invention to increase parallelism, the beam uniformity may also be concurrently corrected (as is well known) by modifying the shape of the scan waveform. It will be noted and appreciated, however, that such uniformity adjustment has no effect on the parallelism of the ion trajectories within a scanned ion beam. Accordingly, the long awaited concurrent, but independent, adjustment and correction of the uniformity and parallelism parameters is hereby achieved.

VI. Measuring the Initial Non-parallelism of Scanned Ion Beams

The Origins of Non-parallelism:

Within conventionally known scanning ion implantation systems, an ion beam is produced and passed through a scanner (either a magnetic or an electrostatic device) which deflects the ion beam through a varying angle, which may vary by +/−5 to 10 degrees or more, in order to traverse the wafer (or other substrate) completely. The scan frequency may be up to 1000 Hz or more for an electrostatic scanner, or up to 100 Hz for a magnetic scanner. However, for purposes of this discussion, the scan frequency is deemed to be immaterial.

The scanning may be approximately symmetrical about the undeflected beam axis, or may be 'monopolar'—i.e., scanning through a varying angle on one side only of the undeflected beam axis. The scan waveform, however, is approximately triangular, as it is desired to scan the beam at a uniform transverse velocity across a workpiece such as a silicon wafer, while slowly moving the workpiece in an orthogonal direction, thereby achieving a uniform implant [See for example U.S. Pat. No. 4,980,562].

By placing a suitably shaped dipole magnet or other device in the beam path, much of the angular variation (error) initially produced by the scanner can be substantially removed and an approximately parallel beam is yielded [See for example U.S. Pat Nos. 4,276,477; 4,922,106; and 5,091, 655]. Thus, whatever the particular structural format might be, such devices produce only approximately parallel beams and are collectively referred to herein as a "Coarse Collimators".

Preferably a Coarse Collimator will not only render the scanned beam centroid approximately parallel, but also subdue other aberrations which might cause variations in the angular spread about the beam centroid. For a dipole magnet form of coarse collimator, this is typically accomplished by a combination of curved pole faces and curved (indexed) pole surfaces, a design based on the theory cited in CERN 80-04.

Known Measurement Methods:

One example of a method for measuring the degree of non-parallelism of a scanned beam is disclosed within U.S. Pat. No. 5,180,918. In sum and substance, two arrays of small Faraday cups are obtained and individually inserted into the beam path at different planes orthogonal to the beam's direction. The difference in the time at which the scanned beam passes each Faraday cup gives information about its parallelism.

A second example of a measurement method is provided by U.S. Pat. Nos. 6,313,474 and 6,696,688 which give information on how similar equipment may be used to modify the scan waveform and achieve a uniform implant.

For purposes of future clarity and completeness, the texts of U.S. Pat. Nos. 5,180,918; 6,313,474; and 6,696,688 are explicitly incorporated by reference herein.

A scanned ion beam's non-parallelism may be measured by these and other conventionally known methods. Preferably, however, a particular method for establishing the proper beam axis should be performed before bringing any of the conventional techniques for measuring non-parallelism to bear. Accordingly, such a procedure is described in detail below.

A Process for Establishing the Proper Beam Axis:

The z-axis during implantation is the intended direction of travel for the ion beam. The z-axis can be defined within the system's apparatus by means of a pair of reference marks, but preferably is defined by providing a fixed mount for an optical device which comprises a collimated light source and a means of inspecting the direction of the light. Such an optical device may be an autocollimating telescope, or a laser, or a combination of these.

It is desirable to pass the workpiece substrate for implantation through the ion beam at a tightly controlled angle. Noting that a bare silicon wafer is highly reflective, one can adjust the angle at which a silicon wafer is mounted at the plane of implantation until it reflects the reference light beam back on its initial path - at which point the wafer is mounted precisely normal to the z-axis at the plane. This procedure provides and defines an "axis of parallelism". Autocollimating telescopes are commercially available, and aligning reflective surfaces normal to an axis is their intended function and use.

Figure 10:
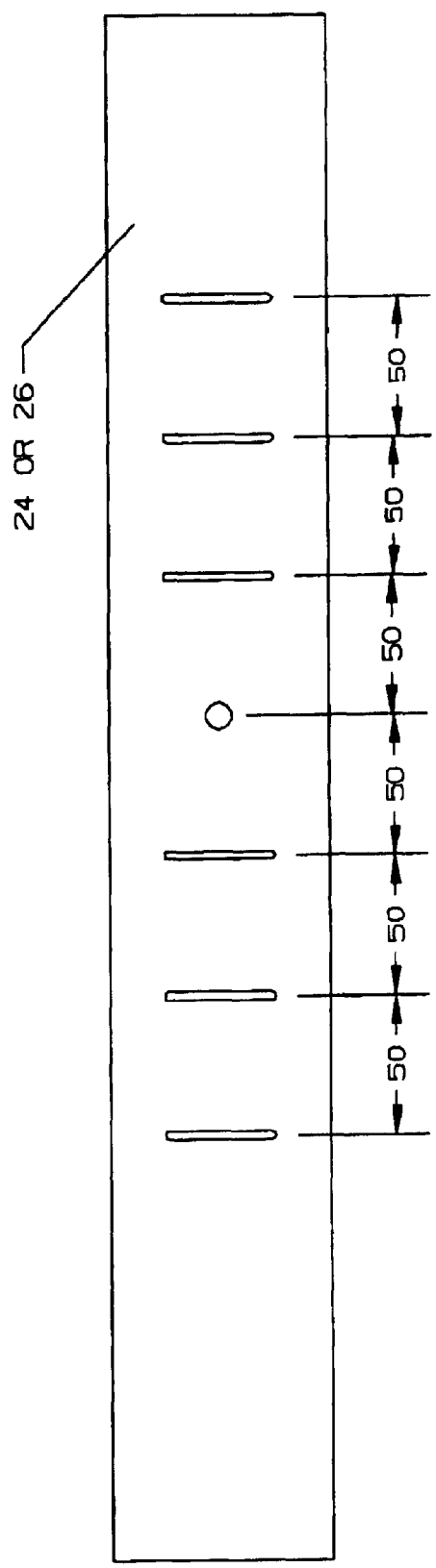
FIG. 10 shows a beam alignment plate, of which two are used in a preferred embodiment of this invention.

Having thus defined an axis of parallelism as well as aligned the targeted mounted holder of silicon wafers until it can hold a reference wafer precisely normal to the z-axis, one now measures the direction of the ion beam with respect to this axis of parallelism. For this purpose, two alignment plates 24 and 26, as illustrated by FIG. 10, are located at different z-axis coordinates. Each alignment plate may be inserted into the beam path at its own precise position downstream of the coarse collimator and the fine-control collimator. Preferably one alignment plate can be inserted at the target plane, but mechanical conflicts may preclude this placement.

As shown by FIG. 10, each plate 24 and 26, contains a row of aligned holes set at known positions; these appear as multiple slot holes and a central round hole. The central round hole is intended to be positioned precisely on the z-axis; and this may be verified (and if necessary, error adjusted out) by means of the autocollimating telescope or laser used to identify and define the z-axis.

The remaining slot holes are disposed in the y=0 plane at different, but accurately known, x-axis coordinates. These slot holes are preferably a regular linear array; and for illustrative purposes, one can consider each of the two plates to have an identical linear array of seven holes, as illustrated by FIG. 10.

Each alignment plate 24 and 26, in turn, is placed in the path of the ion beam while the beam is scanned at a suitable amplitude and with a suitable waveform, typically a sawtooth pattern waveform. The scanned ion beam is thus passed over and through each hole of the alignment plate in turn. Then, as the scanned beam becomes transmitted through each individual hole in the two alignment plates, each transmitted ion beam appears as a current pulse which is subsequently collected in a Faraday cup (or cups); its current is measured; and the moment of the collection of the different current pulses is recorded as a function of time within a scan cycle. For preference, a single Faraday cup ("FC" in FIGS. 3, 8, and 9 respectively) is used, which is permanently mounted behind the target plane TPI.

The difference between the times of the arrival of a current pulse through the first hole of the first alignment plate when compared to its arrival at the first hole of the second alignment plate is proportional to the error of the x-direction of the ions at this point in the scan cycle. With seven holes in each alignment plate, seven different values of x40 at seven different timed points in the first half of a scan cycle can be measured; and the same process can be performed in reverse for the second half of a scan cycle.

The errors recognized after measuring the initial non-parallelism may be then corrected by providing a magnetic field whose y-axis component varies as a function of x, since the field component $B_y$ is responsible for deflecting the trajectories within the x-z plane.

Measuring the Y' Error:

To achieve precision, one must also measure the y' error, which would require a uniform $B_x$ component to correct it. This y' error should be almost constant in time, because of the symmetry of the system in the y=0 plane, as discussed above. One can compensate any static error in y' by providing a uniform magnetic field component, $B_x$, either by using the y-axis steering coils of the preferred fine-control collimator; or, in an adjacent zone at a different z-coordinate, by using a discrete magnetic steering device.

The simplest way of both measuring such a y' error and correcting it is to place both alignment plates 24 and 26 with their range of aligned holes in the beam simultaneously, preferably after correcting the errors in the x' angles. The total average beam current will vary if the component of beam motion in the y-direction is varied; and the maximum transmitted current must occur when the y-component of motion is zero.

To obtain the best sensitivity of detection for y' errors, the beam should be passed through a plate having two holes with small y dimensions, a size for which the slot holes of FIG. 10 are not suitable. Also, it is possible to halt the scanning with the beam positioned over the central hole of the alignment plate, thereby achieving the desired sensitivity. Other alternatives are: to observe only the current through the central hole in each alignment plate—either by monitoring the oscilloscope display; or to use another timing technique which ignores the ion current through the slot holes; or to provide a second position on the alignment plates which inserts an x-axis directed narrow slot (or slots) into the beam. Whichever of these refinements are employed, the $B_x$ magnetic field component may be adjusted to maximize the beam current, at which point the error y' is reduced essentially to zero.

VI. Measuring the Ion Dosing Profile

If the fraction of the scanned ion beam to reach the target plane were 100%, then all that would now be required to perform a precision implantation of ions (into a target workpiece traversing orthogonally in the y-direction through the beam) would be to ensure that the scan velocity of the ion beam was constant—i.e., that the waveform of the beam versus time was a sawtooth pattern. Unfortunately in reality, the transmission of ion beams through optical systems is imperfect; and ion beam transmission will tend to vary as a function of its position on the scan. It is therefore necessary to measure and compensate for such defects. The dosing profile in the x-axis direction imparted by the scanned beam may be determined by any one of several different methods. Described below are two conventionally known methods as well as an entirely new one.

Technique 1:

A linear array of identical Faraday cups can be located close behind the target plane. The height of these cups must exceed the maximum beam height; and the widths of their cup openings must be accurately identical. The ion charge which will be received in each cup can be integrated for one or more beam scan cycles and the ion charge in each cup should be identical. The values of the measured charges represent the dosing profile.

A variant of this method may be performed using the modified system arrangements described previously and illustrated by FIGS. 8 and 9 respectively herein, in which the second alignment plate is inserted into the beam and the pulse ion charge passing through each of the long slots and received by the single large Faraday cup may be recorded. Such a technique requires (i) that the slot holes be taller than the beam; (ii) that the pitch of the slot holes exceed the beam width; and (iii) that the width of the slot holes be accurately identical. If used in this manner, the central hole would preferably be identical to the other holes.

Technique 2:

A second method would provide a traveling Faraday cup, which can be traversed across the beam at or near the target plane in the x-axis direction. The ion charge at multiple locations is integrated for one or more scan cycles.

This technique has the advantage that since one Faraday cup is used, systematic differences (which could distort the profile) are eliminated. The technique is also capable of very fine resolution; however, it is to be hoped that the dosing profile contains no very abrupt features.

Technique 3:

The third and preferred method, capable of very fine resolution, is to remove the two alignment plates from the ion beam; and then measure the beam current in a single, large Faraday cup as a function of time. To convert this data to a profile showing average dose rate versus position requires some additional information, which has already been obtained during the initial empirical measurement of non-parallelism performed earlier.

Firstly, one must have data identifying the relationship between time in the scan cycle and x-position of the beam centroid. This relationship was measured at seven points in each direction of the beam scan using the second alignment plate during the measurement of parallelism.

Secondly, one must have data identifying the relationship between scan position and scan velocity, since the dose rate, $J_x$, is proportional to $I_x/V_x$, where $I_x$ is the current measured at position x in the Faraday cup (the position being obtained by interpolation) and $v_x$ being the beam scan velocity. Clearly, if one knows the position of the beam at seven precise times, one can interpolate the data to determine the velocity, or to obtain greater accuracy, one can fit a polynomial to the data, differentiate, and obtain an accurate profile of the velocity.

Using this procedure, the value of $J_x$ can be determined at any position within the scope of the measurement.

Having obtained the ion doping profile by any of the above methods, it is now possible (via well known methods) to calculate a desired and pre-selected modification to the scan waveform applied to the scanner that would compensate the non-consistency in the doping profile, thereby improving the profile uniformity with which implants can be performed.

VII. A Preferred Method for Adjusting and Aligning the Parallelism of a Scanned Beam and for Controlling the Error Variation of the Angular Spread within the Ion Beam Initially, an ion beam is generated in a vacuum system by well-known methods. After mass-analysis to ensure purity, the beam is scanned using a scanner device which can take different structural forms.

In one embodiment, the scanner device comprises a pair of approximately flat electrodes ("SD" in FIGS. 8 and 9 respectively), 150 mm in z-dimension, with a tapered gap in the x-axis direction (allowing space for the scanned beam). The device has one plate electrically grounded and a second plate connected to a negative polarity power supply. This provides the sawtooth pattern waveform required for a beam with a monopolar scan between about 3 degrees and 15 degrees. The sawtooth pattern initially is a linear waveform, but this waveform will later be modified slightly within the system to control current uniformity. For an ion beam with an energy of 40 keV or less, the greatest magnitude of the potential required on the negative plate of the deflector is about 11 kV, depending on the clearance allowed around the beam.

Conventional Coarse Collimation:

The scanned ion beam is typically deflected through an angle between 30 and 90 degrees, and preferably approximately 70 degrees, by a dipole magnet, whose poles are shaped (using methods familiar to those skilled in the art) so as to render the beam centroids approximately parallel, and also to eliminate variations in $\Delta y'$ as a function of x. As described previously herein, this is a second-order aberration of the magnet optics; and its control is described in SLAC 80-40 (as well as and other texts). The electric current passed through the coils of this dipole magnet can be adjusted between about 10 and 180 amperes to vary the magnetic field, which has a maximum value of about 1.0 Tesla. The dipole magnet can thereby be adjusted to deflect ions of any one of a variety of species; and with energies in a range of at least 1 to 200 keV, to travel approximately parallel to the z-axis of the system. A postacceleration stage may be used to vary the final energy of the ions.

Optical and Mechanical Alignment:

The method of the present invention increases the parallelism of a scanned ion beam. To achieve this purpose, an autocollimating telescope 100 is rigidly attached to the coarse collimator, such as a dipole magnet (as in FIGS. 8 and 9). The autocollimating telescope can either be arranged to look through a precision window into the vacuum; or, alternatively, be attached in place of a removable flange when the vacuum system is vented.

The optical axis of this autocollimating telescope is defined to be the z-axis of the coordinates system; and all other pieces of equipment must be aligned to this defined axis. The telescope itself provides the means of measuring any alignment errors of the physical beamline components. In particular, a person may look through the telescope at a silicon wafer mounted on its holder in the target plane on the means provided for passing the wafer through the beam. The reflection on the wafer surface of the light source (provided as part of the autocollinating telescope) may be observed through the eyepiece of the telescope; and correct alignment of the wafer surface normal to the z-axis is confirmed when the image of the light source becomes centered within the crosshairs of the telescope.

The alignment of the ion beam to the z-axis cannot be directly observed by means of the telescope, and is instead measured in the following manner: As previously described, two alignment plates are provided on movable mechanisms so that each may be inserted individually into the beam path, or retracted. For equipment intended to implant 300 mm sized silicon wafers with ions, seven (7) slot holes of 3 mm width on a pitch of 50 mm are to be used for each plate. The height of the slot holes is greater than the largest beam height that is expected; and it is desirable to restrict the beam height to less than 20% of the substrate height for reasons of efficient beam utilization. Accordingly, the slots are 60 mm high. The central hole may differ for reasons already described herein as well as for easy identification. The mechanism in each instance is adjusted so that the centers of the slot holes lie approximately in the plane y=0, and the central circular hole can be viewed in the telescope and adjusted to lie precisely on the z-axis. Following this alignment, a vacuum can be re-established within the implantation system.

A single Faraday cup, with dimensions 400 mm wide by 70 mm tall, is provided to receive all or most of the scanned beam; and the Faraday cup is magnetically suppressed to prevent slow ions and electrons from distorting the measurement of the current of fast ions. The Faraday cup is preferably permanently located behind the plane of implantation to receive all of the ion beam that has not been previously intercepted by other apertures and objects. With either alignment plate placed in the beam pathway, a series of current pulses can be measured as the beam traverses the slot holes, and a fractional part of the beam briefly reaches the Faraday cup.

Also, in accordance with the modified system shown by FIG. 8, the alignment plates are individually located, one being situated in front of the implantation plane and the other behind it. Preferably, one plate is located in the implant plane. Since the plate at the plane is only used before an implant, and not during the actual implantation process, this plate can be (and must) be withdrawn during the implant process. Nevertheless, by placing this plate in the implant plane, the beam position versus time during each beam scan cycle of the implant process is explicitly determined in the implant plane; whereas, with the modified conventional arrangement, such information can only be determined by interpolation.

Figure 11A:
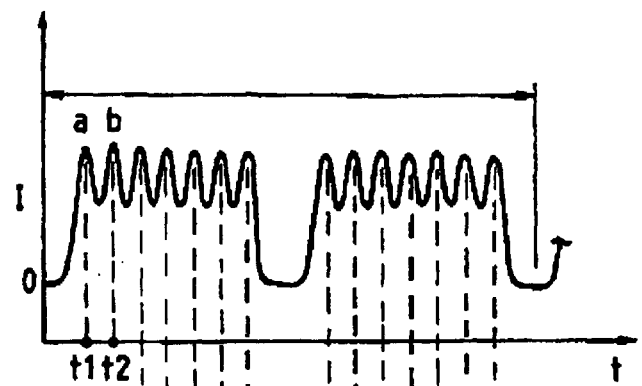
FIGS. 11A and 11B show the current waveform that can be observed as the beam is scanned across and through the holes of the alignment plate of FIG. 7.
Figure 12:
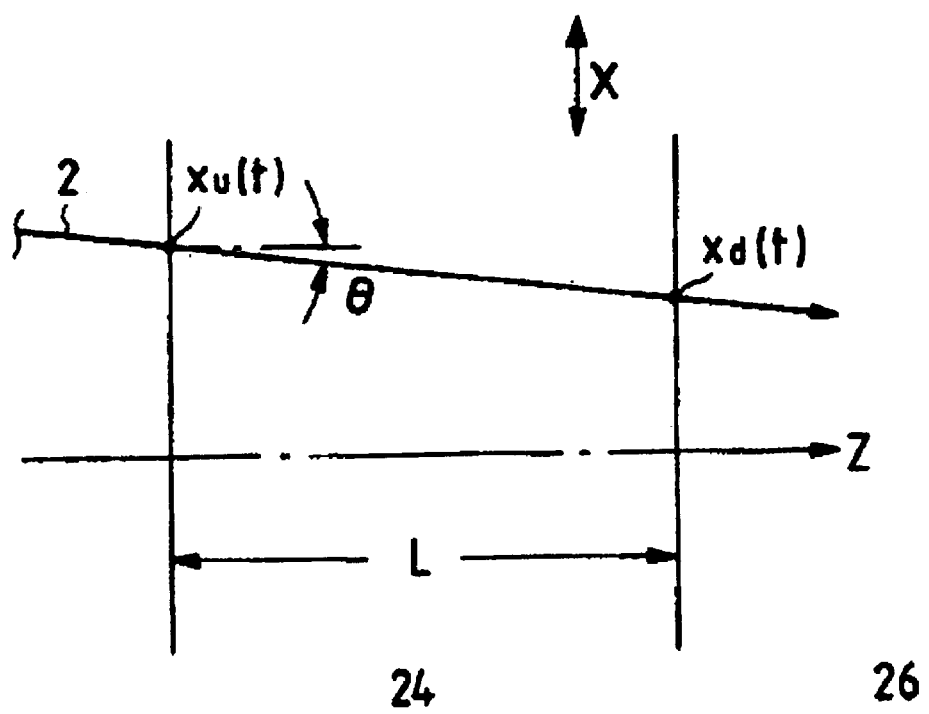
FIG. 12 illustrates how the non-parallelism of the beam trajectories may be calculated from the timing information obtained from the waveform of FIG. 8.

Accordingly, the first alignment plate is inserted into the beam and the second is retracted. The current in the Faraday cup is then measured, via an electronic current-to-voltage converter, on a digital oscilloscope. This will determine, with a precision of better than 500 nsec, the time the beam centroid is scanned across each slot in either plate. FIG. 11A shows a typical waveform that may be expected; and FIG. 12 graphically illustrates how the angle of the beam centroid may be calculated from measurements made using the two alignment plates shown by FIG. 10.

Also, if the central hole of the alignment plate is small, the current transmitted through this hole is significantly less than that transmitted current pulse through the slot holes of the alignment plate, and this can aid in identifying the beam position. The beam should be scanned through a distance exceeding the target width by an adequate but not excessive margin, which is slightly greater than the instantaneous width of the beam 70 and which should preferably not exceed 60 mm in breadth. This overscanned beam is shown as item 72 in FIG. 3.

Finely Controlled Collimation:

The method for increasing parallelism preferably employs the fine collimator/steerer as described previously herein and shown by FIGS 3 and 4. The preferred construct comprises two parallel multideflector sequence arrangements which are located symmetrically about the scanned beam at equal and opposite y-axis coordinates (+/−g) and which extend parallel to the x-axis in its positive and negative directions. Each multideflector sequence comprises a series of electromagnetic deflectors (preferably identical) located such that the beginning of each deflector is aligned with one of the slots in the nearest alignment plate, and the end of each deflector is aligned with the next slot hole in the plate. The number of coil deflectors positioned in series on each support bar in the cascade should be one less than the number of holes in each plate. However, it is deemed advantageous also to provide x-axis steering coils which are positioned beyond the slots of the alignment plate.

The outermost slots of the alignment plate are preferably aligned at or near the limits of the zone in which it is desired to improve the parallelism of the beam, the start and the end of each deflector in the cascade being aligned with a slot hole in the plate. The positions of the outer x-axis steering coils are less critical.

The separation gap distance existing between the first and the second multideflector sequence arrangement must exceed the maximum expected beam height by a safe margin; and these may be located outside the vacuum chamber. Accordingly, a separation gap of 100 mm is preferred. It is advisable to use hollow conductor for the individual windings on the support bar for efficient water cooling, as this allows the deflector thickness to be minimized. It is expected that the maximum required correction is +/−0.5 degrees.

Figure 14:
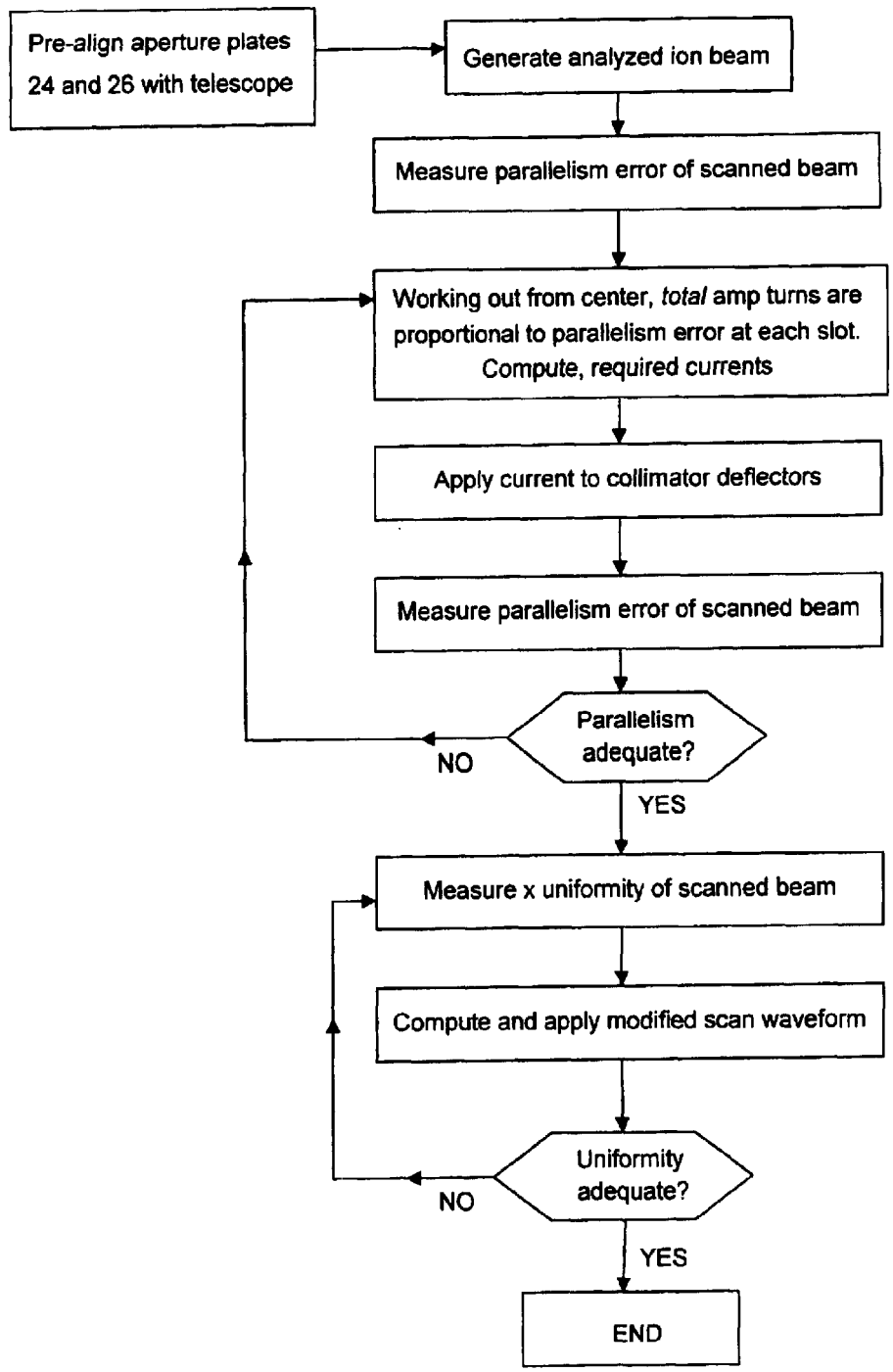
FIG. 14 shows a flow diagram of the method according to this invention for concurrent control of parallelism and uniformity of a scanned ion beam.
Figure 15:
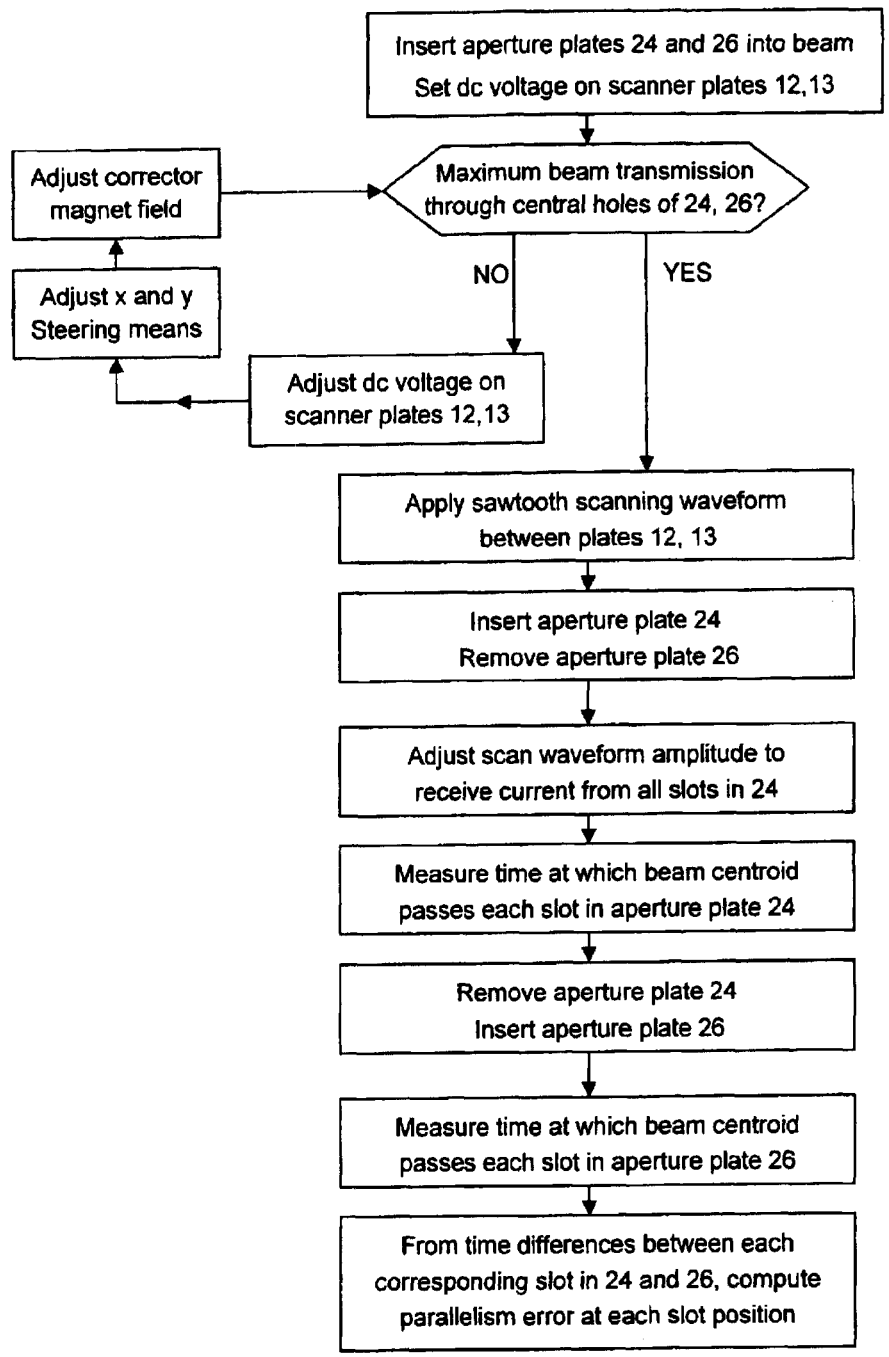
FIG. 15 shows a flow diagram of a preferred method of measuring the parallelism of a scanned ion beam.

The Steps Comprising the Method of Operation:

The method of operation comprises the following steps, which are illustrated and explained by the flow diagrams shown by FIGS. 14 and 15:

Once the system's mechanical alignment is correct, an ion beam is tuned and analyzed. With the scanner set to a constant deflection potential, this beam is transmitted through the central holes in the insertable alignment plates, which may require a small adjustment to the constant deflection potential to steer the beam accurately along the desired path into the corrector magnet. The corrector magnet is adjusted to maximize the beam transmission through the central holes of the plates into a Faraday cup.

To maximize this transmitted beam current, the x-axis steering coils of the fine-control construct may be suitably energized with suitable dc currents. These currents can be adjusted to maximize the transmitted beam current, thereby ensuring correct alignment of the unscanned beam centroid.

Figure 11B:
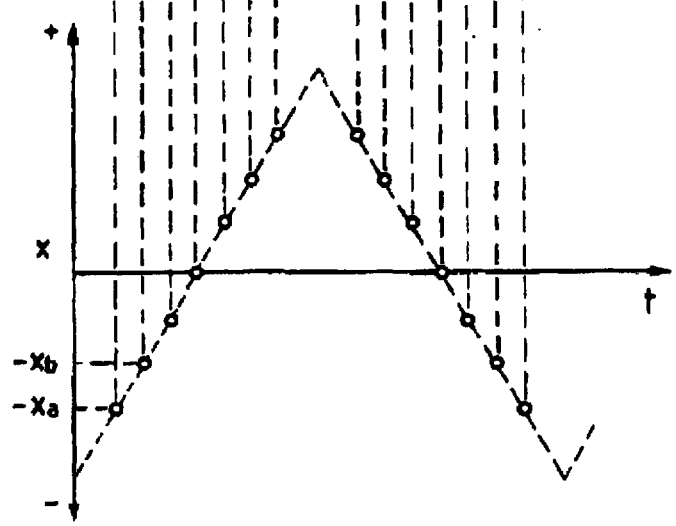

The beam is now scanned with a sawtooth waveform applied between the scanner plates ("SD" in FIG. 9). One alignment plate is inserted in the beam, and the other plate is removed. The amplitude is adjusted until the current received in the Faraday cup, when viewed on a digital oscilloscope (not shown) appears as shown in FIG. 11B, at which point the scan amplitude is sufficient, but not excessive. The oscilloscope scan should be synchronized to the scanner waveform.

The digital oscilloscope is used to determine the time at which the ion beam centroid passes each of the slots in the first alignment plate. At this stage, the first alignment plate is withdrawn, the second alignment plate is inserted, and similar data is recorded.

The Underlying Theory of Operation:

Mathematically, one can denote the time of beam passage through the first hole in the first sample plate by the symbol $t_{101}$, and the time of beam passage through the first hole in the second alignment plate by the symbol $t_{201}$, and so on. Thus, the seventh hole of the first plate is denoted by the suffix 107.

Similarly, the return scan data points are numbered $t_{108}$ through $t_{114}$, denoting data points 8 through 14, with point 14 denoting the final passage of the beam through hole 1. The distance between the two sample plates is "d", and the beam is known to be traveling with a velocity "v". The pitch of the holes is denoted by the symbol "p", which in this embodiment has a value of 50.0 mm.

The x' angle denoting the direction of the beam centroid when passing through hole 1 of each plate is given by the following expression:

$$x'_1 = (t_{201} - t_{101} - v/d) * v_s/d$$

where the beam scan velocity $v_s$ is approximated by $$v_s = \sim p/(t_{202} - t_{201})$$

The expression for $x'_1$ is accurate at the time $(t_{101}+t_{201})/2$ in the plane of the first sample plate. The expression for vs is an approximation, since it assumes that the beam is scanning at a constant velocity. It is useful to fit a polynomial function to the data of beam position vs time when established, and differentiate it to obtain an accurate function of the scan velocity. Thus, a more accurate value may be obtained and substituted. After correction of the errors, the scan velocity function is useful in computing a doping profile, as is discussed more fully below.

For example, with seven (7) slot holes in each plate, seven values of the angular deviation can be recorded. The beam steering coils should already have been adjusted, so that the beam direction through the central hole has zero error. For each of the holes in the first plate, the required magnetic field to be provided by the deflectors to correct the deviation at this location can be calculated. The required field is proportional to the magnetic rigidity and to the angle required.

The constant of proportionality can be determined, if desired, by experiment: If, for illustrative purposes, the assumption (admittedly incorrect) is that the magnetic field at the center (x=0) of the multipole remains constant, one simply calculates the number of ampere-turns required to generate the required field for |x|>0. In this manner, the current required in each coil can be calculated.

Presuming that the separation distance between the ferromagnetic support bars is 2g, then $\Delta B_y = \mu_0 nI/g$, where I is the total current flowing in each coil, and n is the number of turns. $\Delta B_y$ is the change in $B_y$ across the x-dimension of each coil pair, so if $B_y=0$ (as assumed) at the center, then the field in line with the next slot in the plate is defined. It is a simple matter to extend this process to each slot position in turn.

Depending on the distribution of ampere-turns on each side of the x=0 plane, the magnetic scalar potential at the center of the support bar will not be zero; and as a result, the field $B_y(0)$ at the center will not be zero as assumed. This will cause the whole beam to be steered systematically in either the positive or negative x-direction. This steering effect can be compensated by passing a suitable current through the x-axis steering coils. This adjustment may be pre-calculated or by repeating the steering correction made at the outset.

Figure 13:
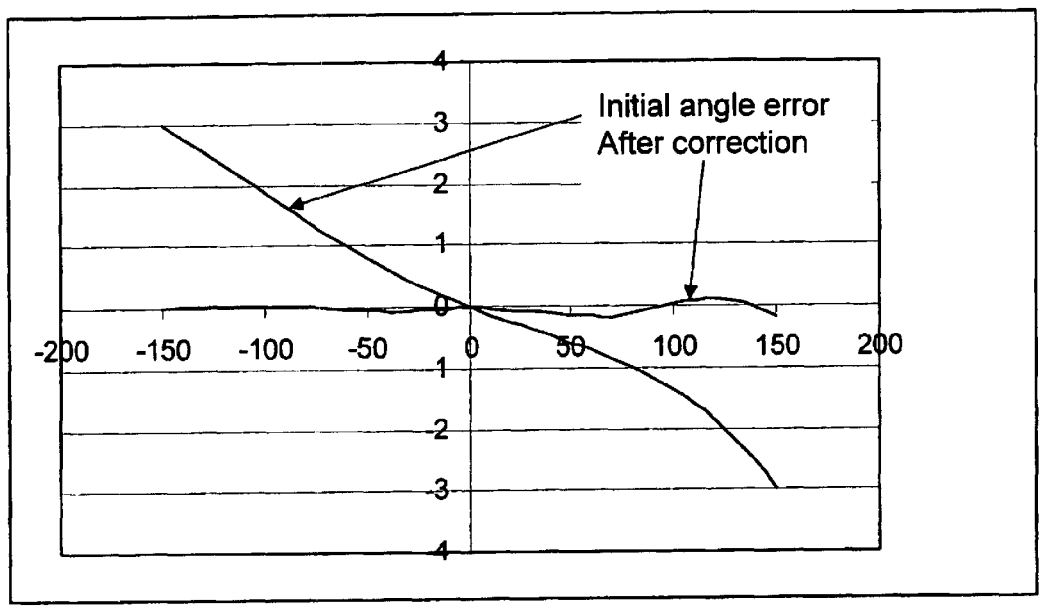
FIG. 13 shows an example of a non-parallel ion beam and its correction using only four pairs of deflectors.

FIG. 13 illustrates the reduction in non-parallelism that may be obtained using four pairs of coils, and five sampling slots in each aperture plate. The attenuation is of the order of $1/n^2$, where there are 2n active coils, so n=4 and the attenuation is of the order of $\frac{1}{16}$.

Orthogonal Effects on Beam Collimation:

In general, the ion optical properties of a dipole magnet used in prior art systems to correct the parallelism of scanned ion beams have an undesirable property in that the focusing of the instantaneous ion beam, and therefore the angular spread $\Delta y'$, is a function of the scan angle. It is desirable to minimize this effect in order that the size and particularly the angular distribution of the ion beam remain reasonably constant as the beam is scanned across the implanted target.

It is well known that a region in vacuum of uniform magnetic field gradient, $dB_y/dx$, must also have a corresponding term, $dB_x/dy$, of equal and opposite magnitude (Maxwell's curl equation). From this mathematical corollary, it follows that a region of non-uniform field configured to focus a beam in the x-axis direction must also defocus the beam simultaneously in the y-axis direction. Such effects are well-known in the use of quadrupole lenses, where the acronym 'FODO' refers to a pair of lenses which focus then defocus in a given plane; and it is known that they have a defocusing followed by focusing effect in the orthogonal plane.

This general rule also applies locally to the fine-control collimator described herein. It has the effect that any zone lying between a cascade of oppositely situated deflectors, which are energized and in which a field gradient is established, will cause some focusing or defocusing of the beam in the orthogonal direction. However, it depends on the specific beam conditions and system design whether such focusing (or defocusing) is beneficial or undesirable.

In some circumstances, therefore, it may be desirable to incorporate a second fine-control collimator, either fixed or a variable in position, at a second location in the line of the beam upstream of the coarse collimator (the dipole magnet). This second fine-control collimator can be used to correct undesirable variations in focusing of the corrector magnet and to provide control of undesirable orthogonal effects in the downstream multipole lens.

In these instances also, it is essential that the coarse collimator employed (the dipole magnet) be designed to eliminate the second-order aberration causing variation in $\Delta y'$. The amount of adjustment available through the use of two fine-control collimators for controlling this aberration is very limited; and is only sufficient to compensate for undesirable small residual variations in $\Delta y'$. Within this limitation, the use of a second fine-control collimator provides the capability to adjust the optics for best overall beam collimation.

The present invention is not to be limited in form nor restricted in scope, except by the claims appended hereto.

What I claim is:

1. In an ion implantation apparatus including a source for the generation of charged particles as an ion beam, a scanner which deflects the ion beam through a varying angle to yield a scanned ribbon beam, and a plane surface for the implantation of charged particles in the scanned ion beam into a workpiece which is moved through the scanned beam, the improvement of a fine-control collimator/steerer for accurate collimation and alignment of scanned beams, said fine-control collimator/steerer being comprised of:

first and second multideflector sequence arrangements symmetrically encompassing the width of the scanned ribbon beam, wherein each said multideflector sequence arrangement comprises
   (1) a linear support bar comprising ferromagnetic material and having a fixed length and girth, and
   (2) at least two coil deflectors wound independently and positioned adjacently at pre-chosen sites on said support bar, each of said coil deflectors being formed of electrically conductive wire and being wound to lie orthogonally to said support bar, and
   (3) at least a pair of steering coils wound independently and positioned individually at each end of said support bar;
first on-demand controls for passing electrical energy of variable current independently and concurrently through each adjacently positioned coil deflector on each of said support bar of said first and second multideflector sequence arrangements, whereby
   a. each adjacently positioned coil deflector becomes energized,
   b. each energized coil deflector independently generates an adjustable local magnetic potential gradient of limited breadth and a magnetic field extending orthogonally between said linear support bars,
   c. a plurality of said magnetic potential gradients of limited breadth concurrently and collectively form a contiguous magnetic field orthogonally extending between said first and second multideflector sequence arrangements, and
   d. each adjustable local magnetic potential gradient within said contiguous magnetic field can be individually and concurrently altered at will to yield a pre-selected magnetic field gradient profile which extends over the linear length of said support bars;
second on-demand controls for passing electrical energy of variable current independently and concurrently through each said steering coil positioned at the ends of each said support bar whereby said steering coils become energized and generate an orthogonally extending magnetic field of limited breadth and an adjustable local magnetic potential gradient at each end of said linear support bar;
a spatial channel bounded by said mulfideflector sequence arrangements for applying a contiguous magnetic field and a pre-selected magnetic field gradient profile to a scanned ion beam traveling therethrough, wherein the parallelism for a scanned ion beam becomes finely controlled and more accurate.

2. The fine-control collimator/steerer as recited by claim 1 wherein the ion implantation apparatus includes a coarse collimator.

3. The fine-control collimator/steerer as recited by claim 1 wherein said independently wound and adjacently positioned coil deflectors on said support bar are between four and thirty in number.

4. The fine-control collimator/steerer as recited in claim 1 further comprising:
   electrical apparatus for supplying a programmable electric current independently to each coil deflector on said first multideflector sequence arrangement; and
   electrical apparatus for supplying an equal and opposite current independently to each coil deflector on said second multideflector sequence arrangement.

5. The fine-control collimator/steerer as recited in claim 1 further comprising electrical apparatus for superimposing a constant electric current in the same direction to all said coil deflectors sufficient to deflect a scanned ion beam in a measurable degree.

6. The fine-control collimator/steerer as recited in claim 1 further comprising:
   a thin-layer wire wrapping wound over the linear length of each said support bar; and
   means of applying an identical current in the same orientation to each said thin-layer wire wrapping effective to generate a constant magnetic field over the linear length of each support bar and deflect a scanned ion beam in measurable degree.

7. The fine-control collimator/steerer as recited in claim 1 further comprising apparatus suitable for measuring the instantaneous angular deviation ion beam relative to a reference axis at a plurality of points, such measurements being made in at least one direction orthogonal to the reference axis, and by which the electrical currents in said coil deflectors are adjusted responsive to the measured angular deviations and reduce the deviation of the ion beam from the reference axis.

8. A method of improving ion beam collimation in a hybrid-scan ion implantation system which includes an ion source, an analyzer magnet, a beam scanner scanning the beam within a plane, a coarse collimation device for converting the scanned beam into an approximately-parallel scanned ribbon beam, and a mechanism for passing a workpiece through the scanned ribbon beam at a target plane in a direction generally orthogonal to the direction the beam is scanned and implanting a substantially uniform dose of ions into the workpiece held at that plane, said improved collimation method comprising the steps of:
   defining a reference axis of parallelism in a known orientation relative to the plane at which the workpiece is to be implanted with a dose of ions;
   measuring the error in the direction of the beam centroid with respect to said reference axis within the plane at which the beam is scanned;
   generating a controllable region of magnetic field and an adjustable magnetic field gradient profile in a direction substantially orthogonal to the plane at which the beam is scanned; and
   adjusting the magnetic field gradient profile in response to said error measurement of beam centroid direction; and
   applying said adjusted magnetic field gradient profile across the breadth of the beam such that said errors in the direction of the beam centroid are substantially eliminated relative to the plane at which the workpiece is to be implanted.

9. The method as recited in claim 8 further comprising the steps of:
   measuring the component of motion of the beam centroid orthogonal to the plane within which the beam is scanned; and
   providing a region in which there is a uniform component of magnetic field transverse to the beam and lying in the plane of the scan whose magnitude and direction are controlled, whereby the measured component of motion of the beam centroid in the y- axis direction is substantially eliminated.

10. The method as recited in claim 8 or 9 further comprising the steps of:
   measuring the profile in the direction in which the beam is scanned of the dose rate provided by the ion beam; and
   modifying the scan waveform to adjust the beam scan velocity, whereby the uniformity of the dosing of the workpiece with the ions in the beam is improved.

11. The method as recited in claim 8 or 9 wherein the coarse collimation device is a dipole magnet comprising pole pieces which are shaped in a manner that substantially eliminates that ion optical aberration which causes a variation in the spread of angles about the beam centroid as a function of the beam position within its scanned envelope.

12. The method as recited in claim 8 or 9 further comprising providing an additional controllable region of magnetic field at an upstream location, whereby the gradient of the magnetic field is caused to vary as a function of position in a manner which reduces residual high-order aberrations.

13. The method as recited in claim 8 wherein said controllable region of magnetic field is created by means of two sequential arrangements of coil deflectors, one on each side of the plane in which the beam is scanned, which extend orthogonal to the beam and lie parallel to the direction in which the beam is scanned.

14. The method as recited in claim 8 wherein said controllable region of magnetic field is created by means of movable pole pieces within a dipole magnet used to collimate the scanned ion beam.

15. The method as recited in claim 8 or 9 wherein said controllable region of magnetic field is created by using a fine-control collimator/steerer.

16. A method of improving the beam collimation and uniformity in a hybrid-scan ion implanter which includes an ion source, an analyzer magnet, a beam scanner scanning the beam within a plane, a coarse collimation device for converting the scanned beam into an approximately parallel-scanned ribbon beam, and a mechanism for passing a plane workpiece through the scanned ribbon beam in a direction generally orthogonal to the direction the beam is scanned, thereby implanting a substantially uniform dose of ions into the workpiece, said method comprising the steps of defining an axis in a known orientation to the workpiece to be implanted;

measuring the error in the direction of the beam centroid with respect to said axis both within the plane and orthogonal to the plane within which the beam is scanned;

providing a controllable region of magnetic field substantially orthogonal to the plane in which the beam is scanned;

adjusting the field to vary along the long dimension of the beam envelope in response to the measurement so as to substantially eliminate the errors in direction of the beam centroid, both within said plane and orthogonal to said plane;

measuring the profile in the dimension in which the beam is scanned of the dose rate provided by the ion beam; and modifying the waveform with which the scanner scans the ion beam so as to modify said dose rate profile and to cause said dose rate profile to conform more closely with a desired profile.

* * * * *